(12) United States Patent
Matsuse et al.

(10) Patent No.: US 7,829,144 B2
(45) Date of Patent: Nov. 9, 2010

(54) METHOD OF FORMING A METAL FILM FOR ELECTRODE

(75) Inventors: Kimihiro Matsuse, Inagi (JP); Hayashi Otsuki, Nakakoma-gun (JP)

(73) Assignee: Tokyo Electron Limited, Tokyo (JP)

( * ) Notice: Subject to any disclaimer, the term of this patent is extended or adjusted under 35 U.S.C. 154(b) by 1169 days.

(21) Appl. No.: 11/032,060

(22) Filed: Jan. 11, 2005

(65) Prior Publication Data

US 2005/0191803 A1 Sep. 1, 2005

Related U.S. Application Data

(63) Continuation-in-part of application No. 10/225,228, filed on Aug. 22, 2002, now Pat. No. 6,861,356, which is a continuation-in-part of application No. 09/530,588, filed as application No. PCT/JP98/04983 on Nov. 5, 1998, now Pat. No. 6,838,376.

(30) Foreign Application Priority Data

| Nov. 5, 1997 | (JP) | ................................... 9-319059 |
| Jul. 7, 1998 | (JP) | ................................ 10-207198 |

(51) Int. Cl.
*C23C 16/00* (2006.01)
(52) U.S. Cl. .................................... 427/248.1; 427/250
(58) Field of Classification Search ............... 427/248.1
See application file for complete search history.

(56) References Cited

U.S. PATENT DOCUMENTS

| 4,389,973 A | 6/1983 | Suntoja et al. |
| 4,461,657 A * | 7/1984 | Rana et al. ..................... 420/83 |
| 5,010,032 A | 4/1991 | Tang et al. |
| 5,066,615 A | 11/1991 | Brady et al. |
| 5,106,786 A | 4/1992 | Brady et al. |
| 5,134,451 A | 7/1992 | Katoh |

(Continued)

FOREIGN PATENT DOCUMENTS

JP 64-5015 1/1964

(Continued)

*Primary Examiner*—Timothy Meeks
*Assistant Examiner*—Kelly M Gambetta
(74) *Attorney, Agent, or Firm*—Oblon, Spivak, McClelland, Maier & Neustadt, L.L.P.

(57) ABSTRACT

A method of forming a refractory metal film doped with III or V group elements. The first process gas is supplied from a first gas source through a first gas introducing member to and through a gas supply mechanism toward a substrate within a processing vessel. The second process gas is supplied from a second gas source through a second gas introducing member to and through the gas supply mechanism toward the substrate within the processing vessel. The processing vessel is purged by evacuating the processing vessel by an evacuating mechanism, while supplying the inert gas from a third source through a third gas introducing member to and through the gas supply mechanism into the processing vessel. The supplying the first process gas and the supplying the second process gas are repeated with the supplying the purging gas being carried out between supplying the first and second gases performed so that residual gas present in the processing vessel after performing the supplying of the first and second process gases is reduced to a level of 1 to 30% based on the entire capacity of the processing vessel.

21 Claims, 11 Drawing Sheets

U.S. PATENT DOCUMENTS

| | | | |
|---|---|---|---|
| 5,480,818 A * | 1/1996 | Matsumoto et al. | 438/150 |
| 5,647,945 A * | 7/1997 | Matsuse et al. | 156/345.38 |
| 5,796,166 A | 8/1998 | Agnello et al. | |
| 5,817,572 A | 10/1998 | Chiang et al. | |
| 5,888,588 A | 3/1999 | Nagabushnam et al. | |
| 5,916,634 A | 6/1999 | Fleming et al. | |
| 5,962,904 A | 10/1999 | Hu | |
| 6,015,590 A | 1/2000 | Suntoja et al. | |
| 6,051,492 A | 4/2000 | Park et al. | |
| 6,060,361 A | 5/2000 | Lee | |
| 6,084,279 A | 7/2000 | Nguyen et al. | |
| 6,096,630 A | 8/2000 | Byun et al. | |
| 6,103,607 A | 8/2000 | Kizilayalli et al. | |
| 6,200,893 B1 | 3/2001 | Sneh | |
| 6,284,646 B1 * | 9/2001 | Leem | 438/629 |
| 6,404,021 B1 * | 6/2002 | Koizumi et al. | 257/381 |
| 6,482,733 B2 | 11/2002 | Raaijmakers et al. | |
| 6,536,460 B1 * | 3/2003 | Yelverton et al. | 137/240 |
| 6,573,184 B2 | 6/2003 | Park | |
| 6,602,784 B2 | 8/2003 | Sneh | |
| 6,613,654 B1 * | 9/2003 | DeBoer et al. | 438/506 |
| 6,656,835 B2 | 12/2003 | Marsh et al. | |
| 2001/0034123 A1 | 10/2001 | Jeon et al. | |
| 2002/0009660 A1 * | 1/2002 | Niino et al. | 430/57.4 |
| 2003/0013320 A1 | 1/2003 | Kim et al. | |
| 2003/0064153 A1 | 4/2003 | Solanki et al. | |

FOREIGN PATENT DOCUMENTS

| | | |
|---|---|---|
| JP | 62-188268 | 8/1987 |
| JP | 1-239971 | 9/1989 |
| JP | 5-129231 | 5/1993 |
| JP | 5-347274 | 12/1993 |
| JP | 7-135186 | 5/1995 |
| JP | 7-153716 | 6/1995 |
| JP | 8-264531 | 10/1996 |
| JP | 8-293604 | 11/1996 |
| JP | 9-186102 | 7/1997 |
| JP | 9-199445 | 7/1997 |
| JP | 9-260306 | 10/1997 |
| JP | 10-209073 | 8/1998 |
| JP | 10-294314 | 11/1998 |
| JP | 11-26394 | 1/1999 |
| JP | 11-26757 | 1/1999 |
| WO | WO96/17104 | 6/1996 |

* cited by examiner

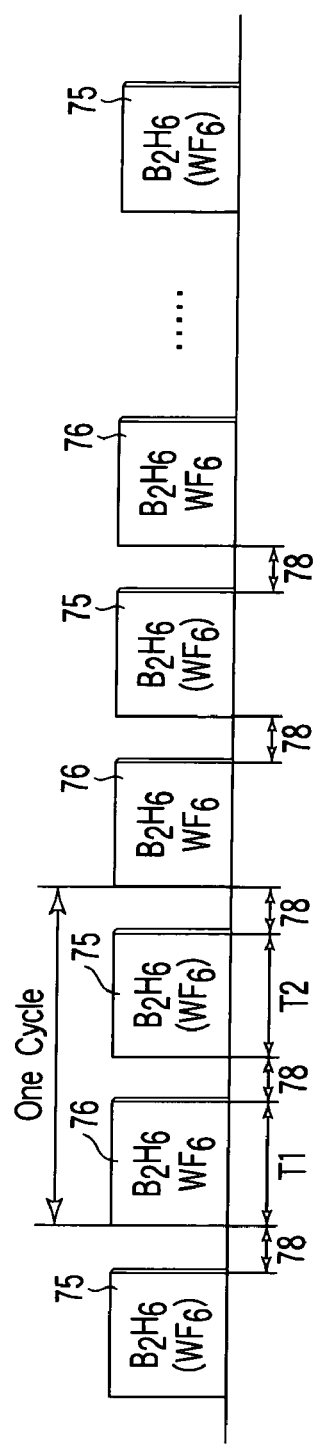
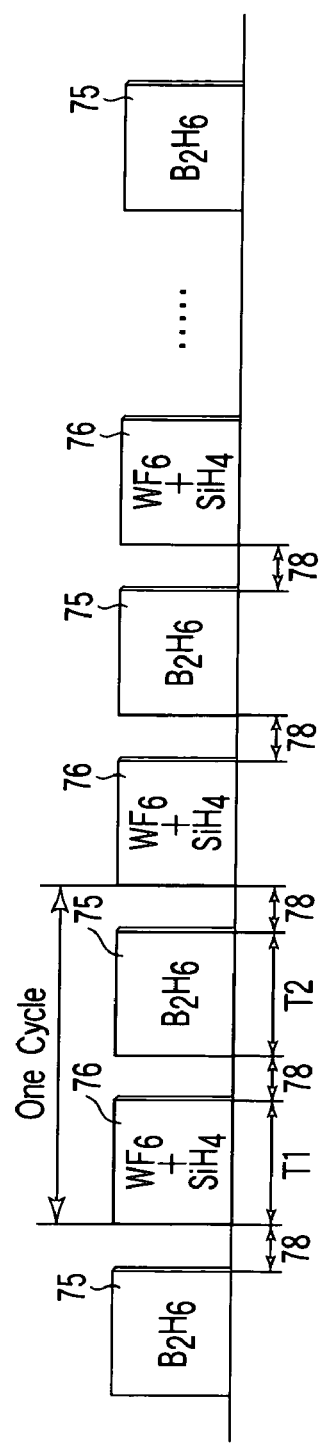
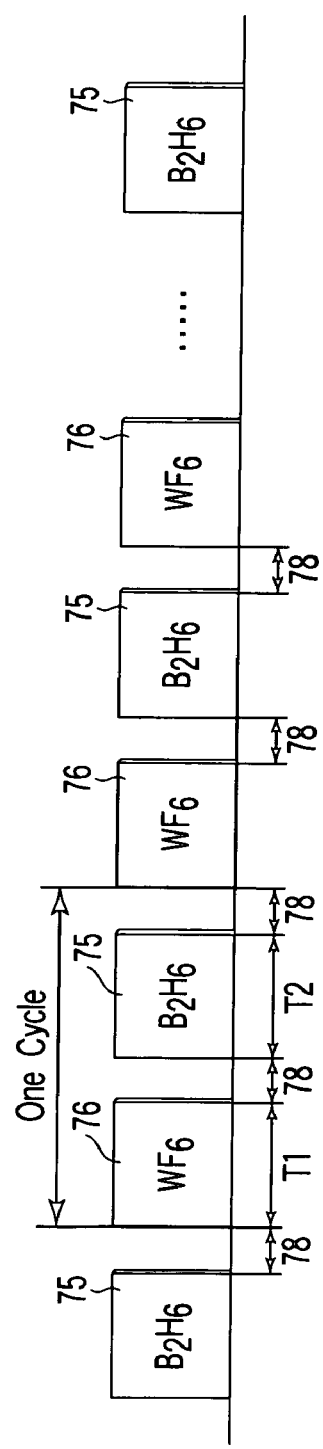
F I G. 7A     F I G. 7B     F I G. 7C

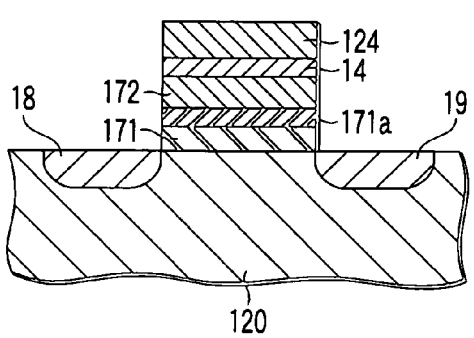 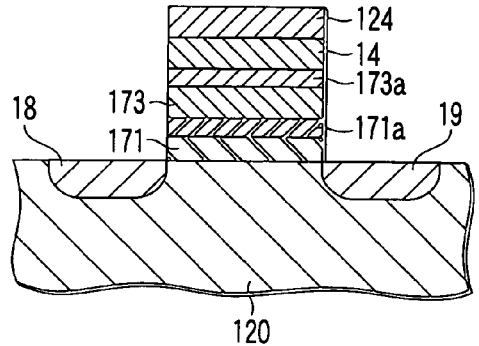
FIG. 13A  FIG. 13B
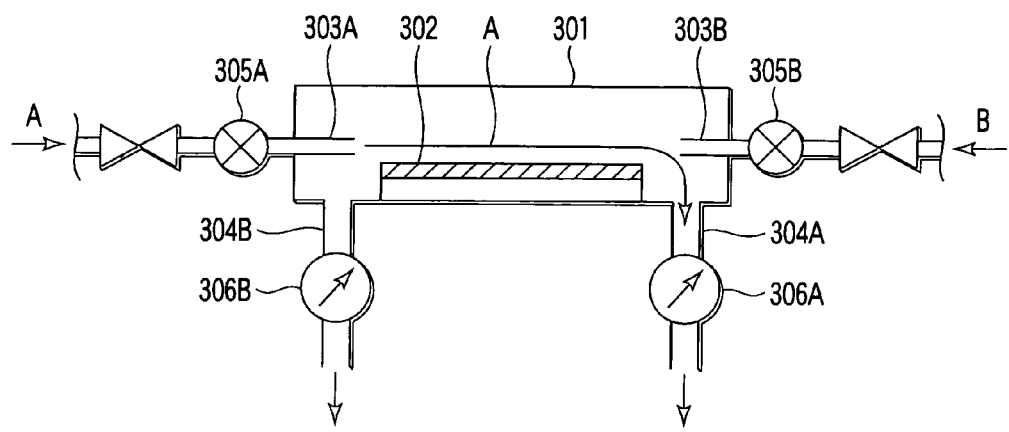
FIG. 16

|  | Comp. Ex. 1 | Comp. Ex. 2 | Ex. 1 | Ex. 2 | Ex. 3 | Ex. 4 | Ex. 5 | Ex. 6 |
|---|---|---|---|---|---|---|---|---|
| Gate structure | Si/SiO$_2$ /polySi /WSi/W | Si/SiO$_2$ /TiSi/ /TiN/W | Si/SiO$_2$ /N/polySi /N/WSi/W | Si/SiO$_2$ /N/highK /N/WSi/W | Si/SiO$_2$ /polySi /N/W | Si/SiO$_2$ /N/W | Si/SiO$_2$ /highK/ /N/W | Si/SiO$_2$ /N/highK /polySi/N/W |
| Resistivity (μΩcm) | 50~60 | 20~30 | <10 | <10 | <10 | <10 | <10 | <10 |
| Leak current (based on SiO$_2$:1) | 1 | 1 | 1 | 1 | 1 | $10^{-1}$ | $10^{-3} \sim 10^{-4}$ | $10^{-3} \sim 10^{-4}$ |
| Response speed | Slow | Rather slow | Good | Good | Good | Better | Very rapid | Very rapid |
| Heat resistance | 1000 | 800 | 900 | 900 | 900 | 900 | 700~800 | 700~800 |

F I G. 14

METHOD OF FORMING A METAL FILM FOR ELECTRODE

CROSS-REFERENCE TO RELATED APPLICATIONS

This is a Continuation-in-Part application of U.S. patent application Ser. No. 10/225,228, filed Aug. 22, 2002 now U.S. Pat. No. 6,861,356 of a Continuation-in-Part application of U.S. patent application Ser. No. 09/530,588, filed May 5, 2000, now U.S. Pat. No. 6,838,376 which is national phase of PCT Application No. PCT/JP98/04983, filed Nov. 5, 1998, which was published under PCT Article 21(2) in English, the entire contents of the said national phase (U.S. patent application Ser. No. 09/530,588) being incorporated herein by reference.

BACKGROUND OF THE INVENTION

1. Field of the Invention

The present invention relates to a method of forming a method of forming a metal film for an electrode.

2. Description of the Related Art

Generally, in the manufacture of a semiconductor integrated device such as a semiconductor integrated circuit, various processes such as film-formation, oxidative diffusion and etching are repeatedly applied onto a semiconductor wafer to form a large number of transistors, capacitors and resistances, and thereafter these elements are connected with each other through wiring patterns. Furthermore, in order to meet persistent demands for a high-performance integrated circuit as well as for a multi-functional integrated circuit, it is now required to further reduce the line width of wiring patterns and to further enhance the integration of the semiconductor elements. Moreover, a multi-layered structure has come to be employed in which circuits themselves are stacked one another with an insulating layer being interposed therebetween.

Since the electric resistance of the wirings or connecting portions is caused to increase due to a decrease in cross-sectional area thereof under the aforementioned circumstances, there is an increasing trend to employ copper, as a wiring material, in place of aluminum which has been generally employed up to date due to the facts that copper is highly resistant to electromigration and relatively low in resistivity even though copper cannot be so easily formed into a film as compared with aluminum.

As for the gate electrode to be employed in a transistor element, the polycide layer structure consisting of a doped polysilicon and a molybdenum silicide or tungsten silicide layer and titanium silicide layer stacked on the doped polysilicon layer has been generally employed. However, with a view to further promote the operation speed and to further lower the resistivity of gate electrode in conformity with the recent trend of further enhancing the integration of semiconductor devices by reducing the line width of wiring to not more than 0.1 μm and of further miniaturizing the semiconductor chip, there have been studied various measures, e.g. measures to dispose a poly-metal gate structure which is replaced the upper silicide layer of the polycide-layered gate electrode by a single metal layer, for example, a tungsten layer, or measures to direct dispose a metal layer on the surface of gate oxide film of a metal-gate structure where even the polysilicon layer is omitted.

Incidentally, copper and tungsten are known to be highly active as they are employed singly, so that they can be easily reacted with other kinds of element. For example, metal copper is high in diffusion coefficient, so that it can be easily diffused into a layer of Si or $SiO_2$, thereby generating the segregation thereof and crystal defects (copper is allowed to react with Si to form copper silicide). As a result, not only the electric resistance of the gate electrode is caused to increase, but also the exfoliation thereof (the exfoliation from the mixing layer of copper) is caused to easily occur.

On the other hand, when the upper layer of gate electrode of polycide-layered structure is constituted by a metal tungsten film, the silicon atoms in a doped polysilicon layer constituting the lower layer of the polycide-layered gate electrode are allowed to interdiffuse and react with the tungsten of the metal tungsten film, thereby giving rise to the formation of tungsten silicide exhibiting a high electric resistance.

It is conceivable, for the purpose of preventing the reaction between the metal copper and the metal tungsten, to employ a barrier metal such as TiN (titanium nitride) which has been conventionally employed. However, since this TiN layer has high resistivity, and is also not so effective as a diffusion barrier to copper and tungsten, this TiN layer cannot be employed as a preferable barrier metal. In particular, the barrier properties of this TiN layer to Cu are very poor.

Furthermore, in order to meet the recent demands for further enhancing the integration, multilayer structure and operation speed of semiconductor integrated circuit, it is desired, when the gate electrode for example is taken up as one example, to make each gate electrode layer thinner so as to lower the electric resistance thereof and to make aspect ratio higher on the occasion of etching work of the gate electrode.

However, as the thinning of polysilicon film, for example, constituting a gate electrode is further enhanced, there will be raised a problem that the polysilicon film is high resistivity. It is also conceivable in this case to interpose a conventionally known TiN film as a barrier metal between the tungsten film and the polysilicon layer. In this case however, a barrier metal such as TiN film is high electric resistance and is unsatisfactory for use as a diffusion barrier for copper (because the barrier film is also inevitably made thinner).

Further, with respect to the problem of the disposal of residual gas in a film-forming step, it is proposed in U.S. Pat. No. 6,015,590 that in order to effectively form a thin film, at least 99% of the residual gas should be discharged. According to this U.S. patent, the apparatus thereof is designed such that not only the capacity thereof but also the cross-section of piping become as minimum as possible so as to achieve an effective evacuation. Furthermore, the apparatus according to this U.S. patent is also designed in such a manner that a dead space which makes it difficult to perform the purging of gas can be prevented from being generated. Additionally, according to this U.S. patent, since the capacity of the chamber is designed to become as minimum as possible, the gas flow therein would be inevitably caused to spread as substantially a planer flow to thereby form a "flat" flow pattern. However, according to this U.S. patent, since the design of apparatus is extremely restricted for the purpose of effectively perform the deposition of thin film, it is difficult to actually employ it in combination with a conventional CVD chamber.

BRIEF SUMMARY OF THE INVENTION

Therefore, an object of the present invention is to provide a method of forming a metal film for an electrode, which is suitable to, for example, wiring of a semiconductor device.

In order to achieve the aforementioned object, according to an aspect of the present invention there is provided Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 7A to 7C are time charts illustrating a process for forming a barrier metal.

FIGS. 13A and 13B are cross-sectional views each illustrating other structures of gate electrode.

FIG. 14 shows data wherein a gate electrode according to the present invention is compared with a gate electrode according to the prior art.

FIG. 16 is a schematic view showing another example of an apparatus suitable for performing a method of the present invention.

DETAILED DESCRIPTION OF THE INVENTION

Now, metal films which may be formed by embodiments of the present invention will be explained with reference to drawings.

Figure 1:
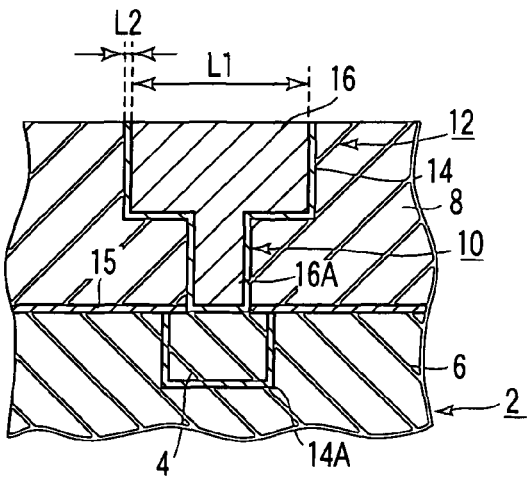
FIG. 1 is an enlarged sectional view showing a barrier metal applied to a Cu dual damascene wiring.
Figure 2:
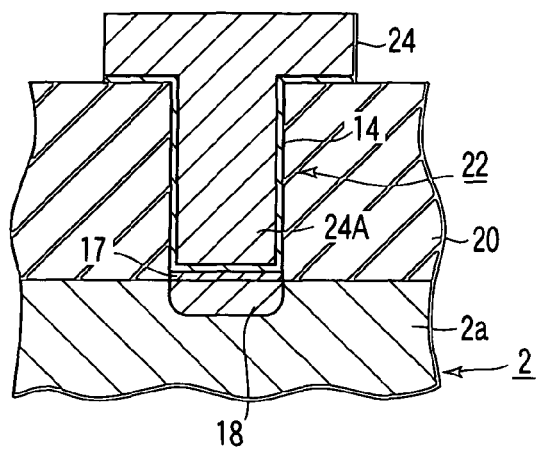
FIG. 2 is an enlarged sectional view showing a barrier metal applied to a contact hole.
Figure 3A:
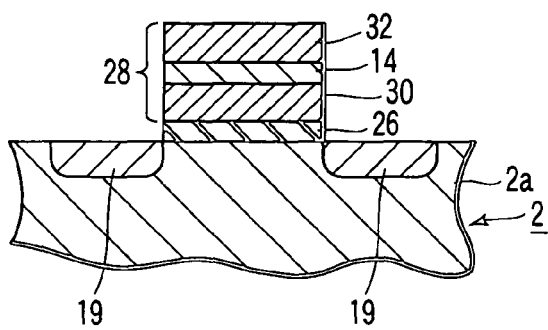
FIGS. 3A to 3C show respectively an enlarged sectional view showing a barrier metal applied to a gate electrode.
Figure 3B:
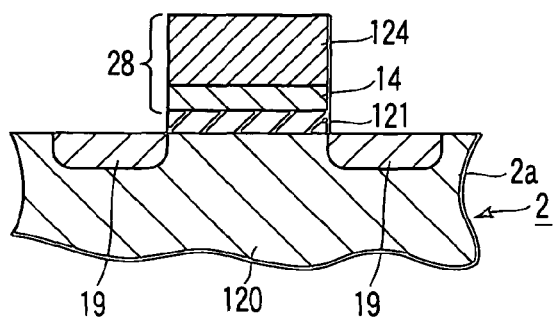
Figure 3C:
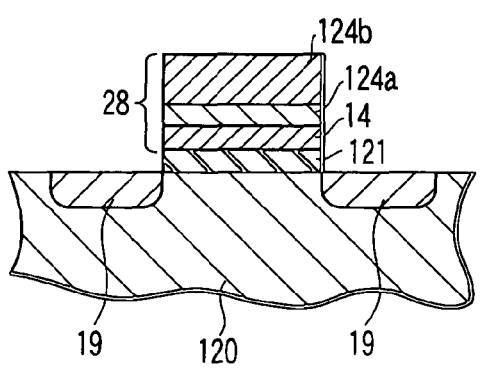
Figure 4:
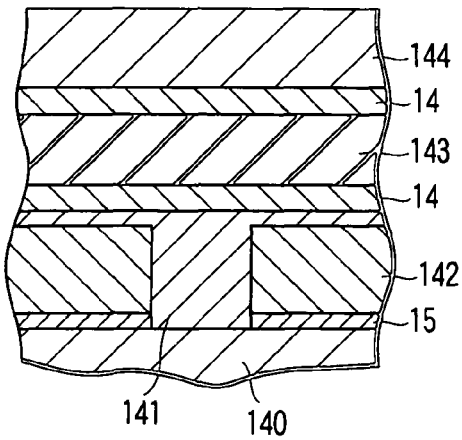
FIG. 4 is an enlarged sectional view showing a barrier metal applied to a capacitor electrode.

FIG. 1 is an enlarged sectional view showing a barrier metal applied to a Cu dual damascene wiring. FIG. 2 is an enlarged sectional view showing a barrier metal applied to a contact hole. FIGS. 3A to 3C show respectively an enlarged sectional view showing a barrier metal applied to a gate electrode. FIG. 4 is an enlarged sectional view showing a barrier metal applied to a capacitor electrode.

The dual damascene process for forming Cu dual damascene wiring as shown in FIG. 1 is employed for forming a multi-layered structure of wiring so as to attain a high-performance and multi-functional device in a semiconductor integrated device, i.e. a semiconductor integrated circuit. This dual damascene process is featured in that the wirings and via-plugs are simultaneously formed so as to enable an upper wiring layer to be connected with a lower wiring layer, thereby making it possible to reduce the number of steps as well as the manufacturing cost for forming the wirings and to minimize the aspect ratio.

In FIG. 1, reference numeral 2 is an integrated semiconductor circuit having a semiconductor substrate such as a semiconductor wafer, and 4 is a lower wiring layer (conducting layer) of the circuit. The periphery of the lower wiring layer 4 is insulated by an interlayer insulating film 6 consisting of, for example, $SiO_2$, plasma-enhanced-TEOS $SiO_2$, SiOF, $CF_x$ (x=1-4), an organic SOG film (MSQ), an inorganic SOG film (HSQ), and a porous $SiO_2$ film, an organic Si polymer film, a C—, H-containing $SiO_2$ film of low dielectric constant. The lower wiring layer 4 can be constituted by metal copper for example. Between the insulating film 6 and the metal copper 4 is interposed an ultrathin barrier metal 14A which is designed to prevent the diffusion of the metal copper 4 according to the present invention. This barrier metal 14A may be constituted by a P type of N type impurity doped refractory metal film including such as W, Ta, Mo, Ni, Hf, $Z_y$, Ru, and Pr; or by a refractory metal silicon film such as $WSi_x$, $TaSi_x$, $MoSi_x$, $NiSi_x$, $ZrSi_x$, $HfSi_x$ or $RuSi_x$ or $PrSi_x$ (x=0.01-2, y=0.02-2). The impurities are elements in a III-V group, for example, B, P or As. On the surfaces of the lower wiring layer 4 and of the insulating film 6, there is deposited a SiN film 15 functioning as an etch-stopper on the occasion of etching work. Reference numeral 8 is an interlayer insulating film consisting, just like the interlayer insulating film 6, of $SiO_2$ to be formed by way of SOG (Spin On Glass), plasma-enhanced-TEOS $SiO_2$, SiOF, $CF_x$ (x=1-4), an organic SOG film (MSQ), an inorganic SOG film (HSQ), and a porous $SiO_2$ film, an organic Si polymer film, a C-, H-containing $SiO_2$ film of low dielectric constant. This interlayer insulating film 8 is deposited so as to cover the $SiO_2$ insulating film 6 and the lower wiring layer 4. Since this interlayer insulating film 8 is formed, for example, by coating an insulating film of low dielectric constant (not more than 3, more preferably 1.5-3) as mentioned above, a wiring layer consisting of a low dielectric layer and a copper layer structure of relatively high operation speed can be realized.

Reference numeral 10 is a via-hole formed in the interlayer insulating film 8 so as to expose part of an upper surface of the lower wiring layer 4, and 12 is a wiring groove formed in the upper surface of the interlayer insulating film 8. Reference numeral 14 is an ultrathin barrier metal made of a refractory metal film or a refractory metal silicon film, for example, $WN_X$ (x=0.1-2), $WSi_xN_y$ (x=0.01-2, y=0.02-2), which is formed on an inner wall surface of the via-hole 10 and on an inner wall surface of the wiring groove 12. Reference numeral 16 is an upper wiring layer (conducting layer) formed of metal copper for example. On the occasion of forming this upper wiring layer 16, the via-hole 10 is also filled with this metal copper, thereby simultaneously forming a via-hole plug 16A.

In this case, the line width L1 of the wiring 16 is 1 μm or less, for example about 0.2 μm. The thickness L2 of the barrier metal 14 is within the range of 0.0001 to 0.05 μm, more preferably 0.0005 to 0.01 μm.

As described above, since the barrier metal 14 which is ultra-thin in thickness and made of a refractory metal film or a refractory metal silicon film is interposed between the upper wiring layer 16 constituted by a thin copper film and the interlayer insulating film 8 formed by way of SOG, as well as between the via-hole plug 16A made of metal copper and the interlayer insulating film 8 in the dual damascene process, the metal copper can be prevented from diffusing into the interlayer insulating film 8 from the via-hole plug 16A as well as from the upper wiring layer 16. As a result, it is now possible to prevent the generation of segregation such as CuSi or of crystal defects. Therefore, the electric resistance of the via-hole plug 16A and the upper wiring layer 16 can be maintained at a low level. Additionally, since the adhesiveness of the upper wiring layer 16 is not deteriorated by the barrier metal 14, it is possible to prevent the metal copper from being inadvertently peeled off. Furthermore, since this wiring structure is constituted by an insulating film of low dielectric constant and a metallic wiring of low electric resistance, it is possible to enhance the operation speed of the device.

By the way, in a modified embodiment of the above-described structure, any one of the lower wiring layer 4 and the upper wiring layer 16 may be formed of a metal selected from the group consisting of Al, W, Cu, Au, Ag and Pt, and the other wiring layer may be formed of a metal selected from the group consisting of W, Cu, Al, Au, Ag and Pt. If both wiring layers 4 and 16 are to be formed using W, it is preferable to form a nucleation film of W at first, the main W film being subsequently allowed to grow by making use of this nucleation film as an origin.

FIG. 2 shows one embodiment wherein the barrier metal formed by a method of the present invention is applied to a contact hole. In FIG. 2, reference numeral 18 is a source or drain region (conductive layer or a layer of dopant diffusion region which can be formed by diffusing a dopant into a Si surface layer 2a) of transistor which is formed in the integrated circuit 2. For the convenience of explanation, the reference numeral 18 is assumed herein as indicating the source region. Reference numeral 20 is an interlayer insulating film employed for entirely covering and insulating the transistor including the source region 18. This insulating film 20 is constituted, in the same manner as explained with reference to FIG. 1, by an insulating film of low dielectric constant. By the way, this insulating film 20 may be formed using plasma-enhanced-TEOS $SiO_2$, SiOF or $CF_x$ (x=1-4). Reference numeral 22 is a contact hole which is formed so as to expose the surface of the source region 18. In order to secure a contact resistance between a wiring 24 (to be explained hereinafter) and the source region 18, this contact hole 22 is provided at the bottom thereof with a layer of metal silicide 17 such as TiSi, CoSi, NiSi, MoSi, etc. After the deposition of the metal silicide layer 17, an ultra-thin layer of barrier metal 14 constituted by an impurity doped refractory metal film or an impurity doped refractory metal silicon film, for example, W $WSi_x$ is formed on the entire inner wall of the contact hole 22 as well as on the upper surfaces of the metal silicide 17 and interlayer insulating film 20. Thereafter, metal copper is deposited all over the surface of the substrate including the interior of the contact hole 22 by means of a reflow or plating method, a CVD method or a PVD method to thereby fill the contact hole 22 with the metal copper, thus concurrently forming a contact hole plug 24A and wiring (conducting layer) 24.

In this case also, since an ultra-thin layer of barrier metal 14 constituted by a refractory metal film or a refractory metal silicon film is interposed between the interlayer insulating film 20 and the contact hole plug 24A made of metal copper as well as between the interlayer insulating film 20 and the wiring 24 made of metal copper, it is now possible to prevent the metal copper from diffusing into the underlying substrate or into the interlayer insulating film 20. Therefore, it is possible to prevent the segregation of the metal copper (the generation of CuSi, etc.) constituting the plug 24A and the wiring 24, and also to prevent the generation of crystal defects, thereby making it possible not only to maintain the resistivity of these plug 24A and wiring 24 to a low level, but also to prevent the adhesion of these plug 24A and wiring 24 from being deteriorated and hence to prevent these plug 24A and wiring 24 from being exfoliated.

By the way, in the foregoing embodiment, the drain or source region 18 having a conductive diffusion zone is formed in the Si substrate 2a. In this case, the wiring 24 may be formed of Al, W, Pt, Ag or Au.

FIG. 3A shows one example where an ultra-thin barrier metal according to the present invention is applied to a gate electrode (polymetal electrode). In FIG. 3A, reference numerals 18 and 19 represent respectively a source region and a drain region of a transistor device formed in the surface of the silicon substrate 2a with a thin gate oxide film 26 being interposed between these source and drain regions. A gate electrode 28 is formed on the surface of this gate oxide film 26. This gate electrode 28 is constituted by a 3-ply structure wherein, for example, a phosphorus-doped polysilicon layer 30, an ultra-thin barrier metal 14 constituted by a refractory metal film or a refractory metal silicon film, for example, W, $WSi_x$ to be formed according to the present invention by means of an ALD (atomic layer deposition) method, and a metal layer 32 made of tungsten are successively laminated onto the gate oxide film 26. The barrier metal may be a laminated structure of a refractory metal silicon and a refractory metal. Since this polymetal gate electrode structure is constructed in such a manner that a silicide layer is omitted from the conventional polycide electrode, the thickness of the resultant structure can be reduced, thereby making it possible to increase the operation speed of transistor and to further enhance the integration of transistor.

In this case also, since the ultra-thin barrier metal 14 which may be formed by a method of the present invention is interposed between the polysilicon layer 30 and the metal layer 32, the silicon atoms in the polysilicon layer 30 and the metallic atoms of the metal layer 32 can be prevented from being interdiffused with each other. As a result, the metal layer 32 can be prevented from being turned into an electrically highly resistive silicide or from generating pits (vacancies) between the polysilicon layer and the metal layer. Thus, the metal layer 32 is prevented from being increased in electric resistance as well as from being exfoliated.

By the way, in the aforementioned polymetal gate electrode structure, the metal layer 32 may be formed of Cu, Al, Au, Ag or Pt. Further, the gate oxide film 26 may be formed of any one of the compounds selected from $SiO_2$, SiOF, $CF_x$ (x=1-4), compounds exhibiting as high dielectric constant as 3-30 such as $Ta_2O_5$, $Al_2O_3$, $HfO_2$, $ZrO_2$, PZT, SBT, $ZrSi_xO_y$, $HfSi_xO_y$, IrO, RuO, $Pr_2O_3$ and $La_2O_3$, and any combination of these compounds. Further, it will be more advantageous if the gate oxide film 26 is formed by means of an ALD (atomic layer deposition) method as this ALD method enables a more densified gate oxide film to be formed. FIG. 3B shows another example where the ultra-thin barrier metal 14 is applied to a metal gate electrode. In FIG. 3B, reference numeral 120 represents an Si substrate, 121 represents a gate oxide film (made of $SiO_2$, SiOF, $CF_x$ (x=1-4), compounds exhibiting as high dielectric constant as 3-30 such as $Ta_2O_5$, $Al_2O_3$, $HfO_2$, $ZrO_2$, PZT, SBT, $ZrSi_xO_y$, $HfSi_xO_y$, IrO, RuO, $Pr_2O_3$ and $La_2O_3$, or any combination of these compounds, or a film of any of these compounds which is formed by means of the ALD method), and 124 represents a metal layer (Cu, W, Al, Au, Ag or Pt). Since this metal gate electrode structure enables a transistor to be operated at a higher speed as compared with the polymetal electrode, this electrode structure is useful in enhancing the integration of transistor devices having a line width of 0.1 μm or less. By the way, if the metal layer 124 is to be formed using W, it is preferable, as shown in FIG. 3C, to form a nucleation film 124a of W at first, a main W film 124b being subsequently allowed to grow by making use of this nucleation film as an origin.

FIG. 4 shows one example wherein an ultra-thin barrier metal to be formed by means of the ALD method according to the present invention is applied to a capacitor electrode to be formed on the upper side of a transistor.

A lower electrode 141 serving as one of the electrodes of capacitor and constituted by a polysilicon layer for instance is formed inside the contact hole which is formed on the surface of a silicon substrate 140. An ultra-thin barrier metal 14 is formed on the upper surface of the lower electrode 141, and for example, a $Ta_2O_5$ layer serving as a dielectric layer 143 of the capacitor is formed on the barrier metal 14. Further, on the dielectric layer 143 also, there is deposited another ultra-thin barrier metal 14, on which a TiN layer for example is formed as an upper electrode 144 of the capacitor. This ultra-thin barrier metal 14 is constituted by a refractory metal film or a refractory metal silicon film, for example, W, $WSi_x$, both films being formed by means of the ALD method. As a result, oxygen or metals constituting the dielectric layer 143 of the capacitor can be prevented from diffusing into the polysilicon layer of the lower electrode 141, thereby making it possible to prevent the generation of an electrically high-resistant silicide or oxide and hence to prevent any increase in electric resistance of the lower electrode 141 and any decrease in capacitance of the dielectric layer 143. By the way, the lower electrode 141 may be formed of Ru, Ir, TiN, Pt, Ag, Au, etc. As for the dielectric layer 143 of the capacitor, it is possible to employ a dielectric material such as $PZT(Pb(Zr_{1-x}Ti_x)O_3)$, $SBT(Pb(SrB_2Ta_2O_4)$, $ZrSi_xO_y$, $HfSi_xO_y$, IrO, RuO, etc. As for the upper electrode 144, it is possible to employ a material which is excellent in barrier properties and low in electric resistance such as Ti(N), $W(N_x)$, $Wsi_x(N_y)$, $TiSi_x(N_y)$, $TaSi_xN_y$, TaN, and any one of these compounds which are formed by means of the ALD method.

Next, a method of forming an ultra-thin barrier metal film by means of the ALD method will be explained.

Figure 5:
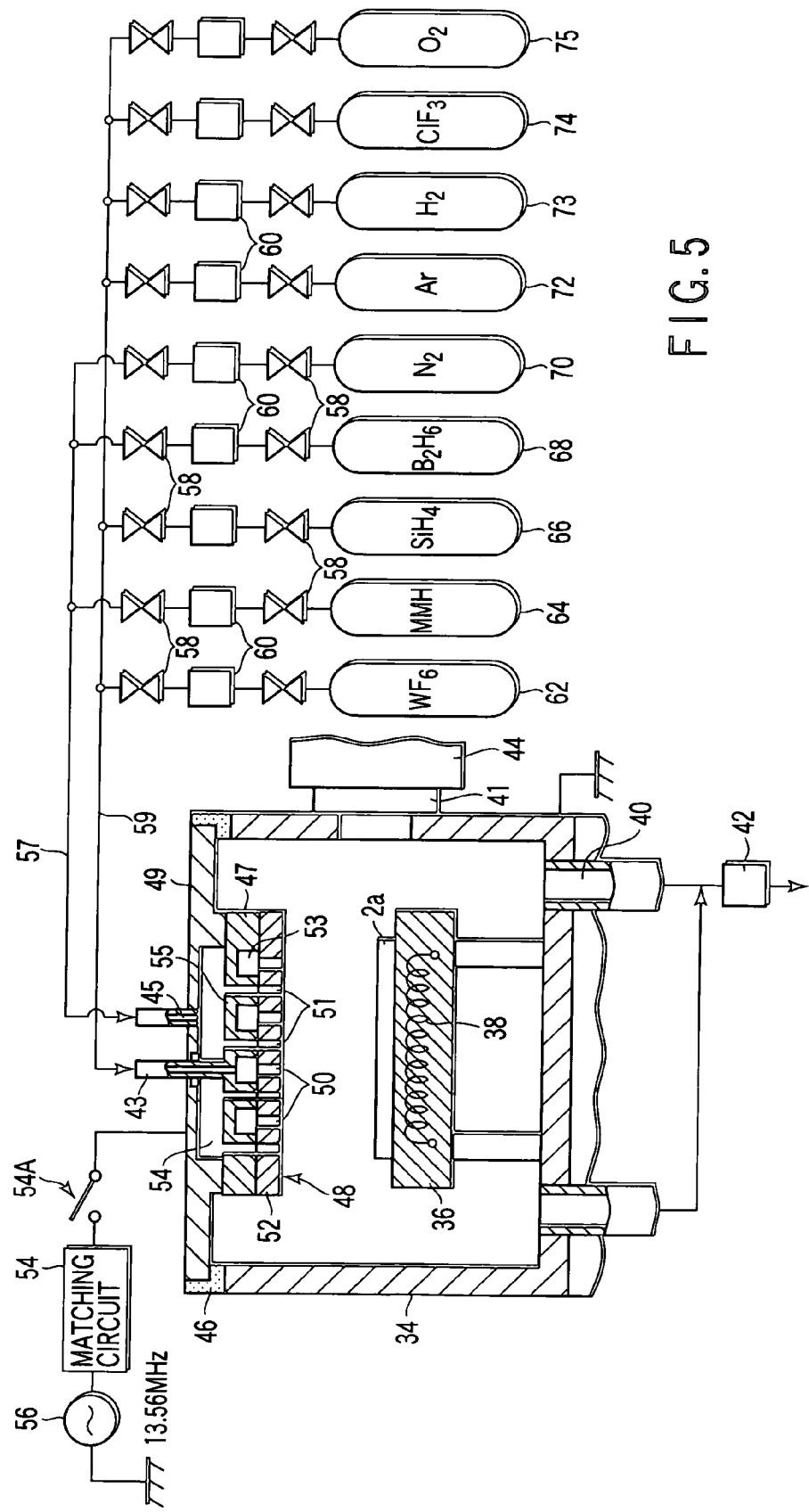
FIG. 5 is a diagram showing a schematic structure of a processing apparatus for forming a barrier metal.

FIG. 5 shows a schematic structure of a processing apparatus for forming the aforementioned ultra-thin barrier metal. First of all, this processing apparatus will be explained. As shown in FIG. 5, this processing apparatus comprises a cylindrical processing vessel 34 made of aluminum for instance, and a mounting pedestal 36 is positioned inside the processing vessel 34 for mounting a silicon substrate 2a thereon. This mounting pedestal 36 is provided therein with a resistance heater 38 for heating the substrate 2a to a predetermined process temperature. By the way, instead of using the heater 38, a heating lamp may be employed for heating the substrate 2a, the heating lamp being disposed below a transparent portion of the lower wall of the processing vessel 34.

The processing vessel 34 and the mounting pedestal 36 are individually grounded. The mounting pedestal 36 also serves as a lower electrode in a case where a high frequency is used. The processing vessel 34 is provided at the bottom wall thereof with an exhaust port 40, which is connected through a vacuum pump 42 with an evacuating system. A loadlock chamber 44 is attached via gate valve 41 to the sidewall of the processing vessel 34, thereby enabling the substrate 2a to be transferred therefrom to the processing vessel 34 or vice versa.

At the top portion of the processing vessel 34, there is mounted, through an insulating material 46, an upper stage diffusion plate 49 of a shower head portion 48 having numerous gas spray holes 50. The upper stage diffusion plate 49 is made of a conductive material and electrically connected, via switch 54A and a matching circuit 54, with a high frequency power source 56 of 450 KHz or 13.56 MHz for instance, thereby making it possible, if required, to apply a high frequency power to the shower head portion 48, thus utilizing the shower head portion 48 as an upper electrode to perform a plasma process. This plasma process may be performed, other than the aforementioned method, by applying a high frequency power to the lower electrode 36 or to both of the upper and lower electrodes.

This shower head portion 48 has an inner space 54 and a plurality of small spaces 53 which are connected with a plurality of gas sources each through an on-off valve 58 and a mass flow controller 60. The valve 58 may be also a fast-change over valve such as a rotary valve or a piezoelectric valve. As for the gas source, it may be optionally selected, depending on specific requirements, from a $WF_2$ source 62, an MMH (monomethyl hydrazine) source 64, an $SiH_4$ (silane) source 66, a $B_2H_6$ source 68, an $N_2$ source 70, an Ar source 72, an $H_2$ source 73, a $ClF_3$ source 74, $O_2$ source 75, etc. Further, disilane ($Si_2H_6$) or dichlorosilane ($SiH_2Cl_2$) may be substituted for $SiH_4$ gas. By the way, reference numeral 57 denotes a first gas-introducing pipe which is connected with the gas sources 64, 68 and 70. Reference numeral 59 denotes a second gas-introducing pipe which is connected with the gas sources 62, 66, 72, 73, 74 and 75. Reference numeral 43 denotes each of a plurality of second gas supply ports which is attached to the upper stage diffusion plate 49 and with which the second gas-introducing pipe 59 is connected (in figure only one first port 43 is illustrated). Reference numeral 45 denotes a first gas supply port which is attached to the upper stage diffusion plate 49 and with which the first gas-introducing pipe 57 is connected. Reference numeral 47 denotes a middle stage diffusion plate having a plurality of gas spray ports 55, and reference numeral 52 a lower stage diffusion plate made of an insulating material and having a plurality of gas spray ports 50 and 51. The small spaces 53 are formed between the lower stage diffusion plate 52 and the middle stage diffusion plate 47 and respectively communicated with the second gas supply ports 50. The common space 54 is formed between the upper stage diffusion plate 49 and the middle stage diffusion plate 47, and communicated with the first gas spray ports 51 and the first gas supply port 43, so that a first gas is permitted to be introduced into the chamber 34 therethrough. At the same time, the gas supply ports 43, the gas spray ports 50 and the spaces 53 are respectively communicated with each other, so that a second gas is permitted to be introduced into the chamber 34 therethrough. According to this structure, it is possible to enable the first gas and the second gas to be independently introduced into the chamber 34 without permitting these gases to be mixed together in the shower head portion 48, and at the same time, to enable the first gas and the second gas to be alternately introduced into the chamber 34. It is possible in the aforementioned structure to employ two groups of a plurality of nozzles substituting for the shower head portion 48, with first group communicated with the first gas supply line 57 and the second group communicated with the second gas supply line 59.

Next, a method of forming an ultra-thin barrier metal film by means of the ALD method according to the present invention by making use of the apparatus constructed as explained above, as well as a method of forming a wiring structure comprising the ultra-thin barrier metal film will be explained specifically.

In this text, an embodiment where a dual damascene wiring (see FIG. 1) is formed by means of the aforementioned Cu dual damascene process will be explained as one example. By the way, this method of forming a barrier metal can be applied in the same manner to the case where this barrier metal is applied to the contact hole and the gate electrode even though the processes before and after the step of forming the barrier metal may differ from those of this method.

(1) The formation of a W barrier metal doped with impurities such as boron, by means of the ALD method.

Figure 6A:
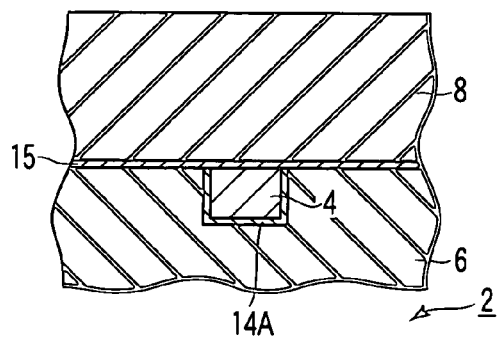
FIGS. 6A to 6F are cross-sectional views for illustrating a Cu dual damascene process.
Figure 6D:
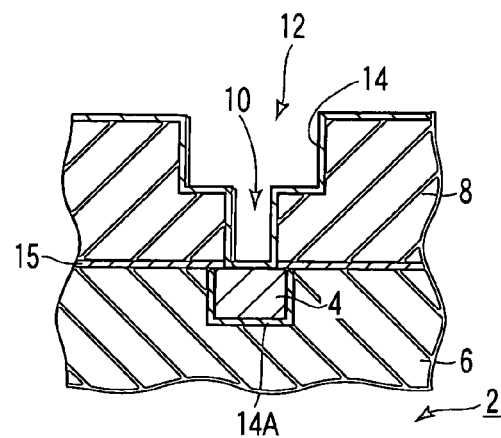
Figure 6B:
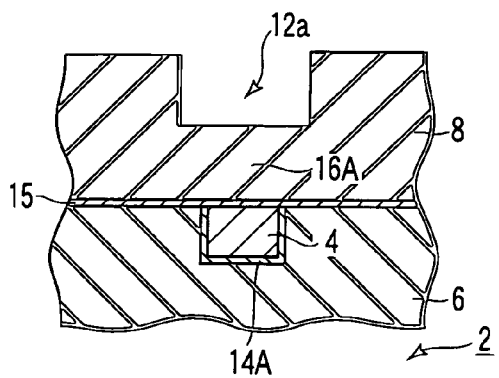
Figure 6E:
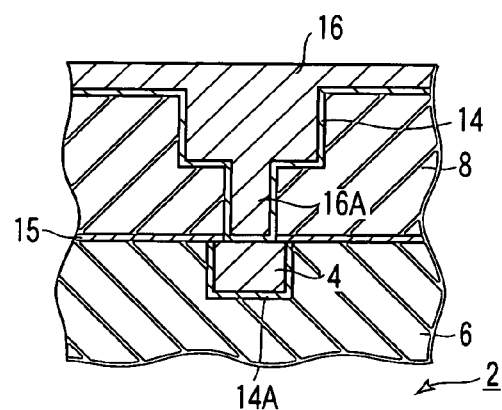
Figure 6C:
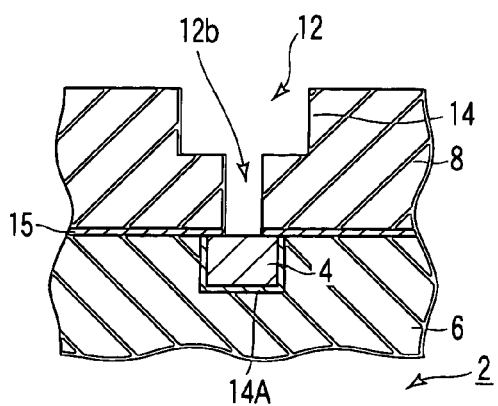

First of all, a method of forming the W barrier metal in one step will be explained. At first, by making use of a separate apparatus differing from the processing apparatus shown in FIG. 5 and by means of a known method, an SiN layer 15 is formed as an etch-stop film on the surface of an $SiO_2$ insulating layer 6 as well as on the surface of a lower wiring 4 formed in the insulating layer 6 of an integrated circuit 2. Then, by means of SOG, an $SiO_2$ interlayer insulating film 8 is formed all over the SiN layer 15 as shown in FIG. 6A. Thereafter, by way of a known process, a first groove 12a is formed, by means of dry etching, in this interlayer insulating film 8 in such a manner as to follow the wiring pattern (FIG. 6B). Furthermore, the portions of the $SiO_2$ interlayer insulating film 8 and of the SiN layer 15, which correspond to a predetermined region in the first groove 12 are etched to such an extent as to expose the underlying wiring 4 to thereby form a second groove (via-hole) 12b. Thus, a dual damascene hole 12 comprising the first groove 12 and the second groove 12b is formed (FIG. 6C).

After finishing the aforementioned treatments to the device, the resultant device is transferred to the processing apparatus shown in FIG. 5, in which the process for forming a barrier metal in the device is initiated.

Upon finishing the mounting of the substrate 2a on the mounting pedestal 36 of the processing vessel 34, the processing vessel 34 is closed air-tight. Then, while keeping the substrate 2a in a predetermined processing pressure, a predetermined processing gas is introduced into the processing vessel 34 from the shower head portion 48 and at the same time, the processing vessel 34 is evacuated so as to maintain the interior of the processing vessel 34 at a predetermined process pressure, thereby performing the process of forming the barrier metal. As for the process gas to be employed in this case, it is possible to employ a first gas including W and a second gas which are individually introduced, to through a separate channel, into the processing vessel 34 in which a barrier metal 14 having a predetermined thickness and consisting of a W film having a predetermined thickness is allowed to deposit by means of the ALD (atomic layer deposition) (FIG. 6D). Each of the first and second gases may be selected at least one stored in the sources 62, 64, 66, 68, 70, 72, 73, 74, 75

More specifically, as illustrated in a first method for forming an ALD-W layer shown in FIG. 7A, a first step 76 for supplying a gas comprising a $WF_6$ gas and $B_2H_6$ gas for a period T1, a second step 75 for supplying the same gas as the first gas or a $B_2H_6$ gas for a period T2. The supplying of the first and second gases may be alternately repeated a plurality of times with a purging step 78 being interposed between succeeding steps so as to evacuate the processing vessel while feeding thereto an inert gas such as Ar gas (or it may be $N_2$ or He) (of course it is possible in this case to perform only the evacuation without performing the purging). That is, one cycle is defined by a first step 76/purging step 78/second step 75/purging step 78, and the cycles are repeated to form a film containing W of a desired thickness.

In a second method as shown in FIG. 7B, a gas comprising a $WF_6$ gas and an $SiH_4$ gas is used in the first step 76, and a $B_2H_6$ gas is employed in the second step 75.

In a third method as shown in FIG. 7C, a gas comprising a $WF_6$ gas is used in the first step 76, and a $B_2H_6$ gas is employed in the second step 75.

The first to third methods are accomplished by a heat CVD method using the apparatus in which no high frequency is applied to any electrode. Alternately, in the case of using other gas containing a refractory metal such as a $TiCl_4$ gas, instead of the $WF_6$ gas, to form a film containing a refractory metal such as Ti, the apparatus shown in FIG. 5 may be used as a plasma metal forming device in which a high frequency is applied to at least one of electrodes.

In the aforementioned methods, if the period extending from a given first step 76 to the next first step 76 is assumed as being one cycle, the method undergoes two cycles. However, there is not any particular limitation regarding to the number of cycle to be taken in the process, since the number of cycle depends on the thickness of the film formed in one cycle. Further, the period T1 of the first step 76, and the period T2 of the second step 75 extend respectively from 0.1 to 60 seconds, preferably from 0.5 to 30 seconds. Further, the period of the purging step 78 extends from 0 to 60 seconds, preferably from 0 to 30 seconds. Moreover, the purging step 78 may be executed by only performing the evacuation of the processing vessel 34. On the occasion of exchanging a kind of gas for a different kind of gas in each of the steps 75, 76 and 78, the quantity of the residual gas of the previous step in the processing vessel 34 should preferably be reduced to a level of 1 to 30% based on the entire capacity of the processing vessel 34, or alternatively, a total quantity of the residual gas of the previous step which is kept free inside the processing vessel 34 plus the residual gas of the previous step which is adsorbed on the inner wall of the processing vessel 34 should preferably be reduced to a level of 1 to 30% based on the entire capacity of the processing vessel 34. Alternatively, the interior of the processing vessel 34 should preferably be evacuated to a vacuum degree of 0.1 Torr or so. When the interior of the processing vessel 34 is evacuated to such a level as described above, the residual materials of the previous step can be sufficiently removed for the next step. However, even if the residual materials of the previous step is left remained at a level of 1 to 30% based on the entire capacity of the processing vessel 34, the film to be formed under such a condition would be sufficiently high in density as well as in barrier property, depending on the presence of any dead spaces for a gas in the processing vessel 34.

In the aforementioned embodiments, an 8-inch wafer is used as the substrate 2a and the flow rate of each of the process gases should be: about 2 to 100 sccm, preferably 5 to 50 sccm for the $WF_6$ gas, and about 10 to 300 sccm, preferably 10 to 150 sccm for the $B_2H_6$ gas (in the case of the wafers having a diameter of more than 8 inches, the quantity of gas to be employed should preferably be at least one time as large as the quantity of gas to be employed for the 8-inch wafer, more preferably 1.5 to 6 times as large as the quantity of gas to be employed for the 8-inch wafer, the quantity of gas to be employed increasing in proportion to the capacity of the chamber). The process temperature should preferably be in the range of 200 to 500° C., more preferably about 300 to 450° C., and the process pressure should preferably be in the range of about 0.5 to 80 Torr, more preferably 1 to 20 Torr. The film-forming rate during one cycle should preferably be 1 to 200 angstroms/cycle, more preferably 1 to 50 angstroms/ cycle. If dichlorosilane is to be employed in place of silane as a reducing gas, the process temperature should be adjusted to the range of about 400 to 650° C. with other conditions such as the gas flow rate and the process pressure being the same as described above. It is possible as another kind of reducing gas to employ disilane, $H_2$. By the way, these numeral values or ranges including the values or ranges to be set forth hereinafter represent merely one example, so that they can be appropriately changed in order to obtain optimum conditions. Alternately, a gas such as an $O_2$ gas may be used to oxidize the metal film, instead of the reducing gas.

It is possible, by means of the aforementioned ALD method, to form an ultra-thin and high density barrier metal 14 constituted by a refractory metal film. Of course, it is possible to apply these steps to the formation of the barrier metal 14A.

When the formation of the barrier metal 14 is accomplished in this manner, the substrate 2a is taken out of the processing apparatus, and metal copper as a wiring metal is deposited in the form of sheet on the surface of the substrate 2a by means of CVD method or PVD method. Concurrent with the aforementioned deposition of metal copper, the dual damascene hole 12 is filled with the metal copper by means of electrolytic or nonelectrolytic plating method, CVD method or coating method (spin coating). It is possible, in this manner, to fill the via-hole 12b with a metal copper plug 16A concurrent with the filling of the first groove 12a with metal copper for constituting the upper wiring 16 (FIG. 6E). By the way, the via-hole 12b may be filled with Al by means of a reflow, CVD or PVD method.

Figure 6F:
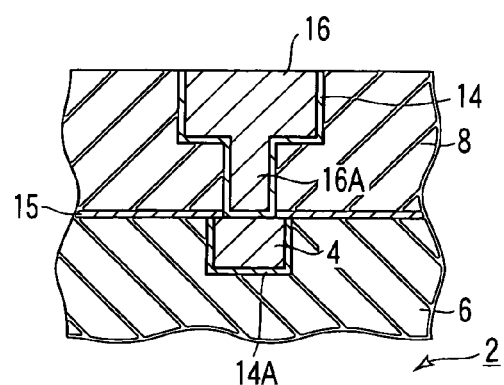

Thereafter, the substrate having metal copper deposited in this manner is taken out of the processing apparatus and is subjected to a CMP (Chemical Mechanical Polishing) treatment to thereby remove any redundant metal copper that has been deposited on the surface of the substrate, thus forming the upper wiring pattern (FIG. 6F). It is possible in this manner to accomplish the formation of the Cu dual damascene wiring.

In the embodiments, if necessary, a nitriding gas such as a $NH_3$ gas may be additionally employed to nitride the refractory metal film for forming the barrier metal 14. However, MMH gas or any kind of gas containing N may be substituted for the $NH_3$ gas. Additionally, if required, an inert gas such as Ar gas, $N_2$ gas or He gas may be employed as a carrier gas. Moreover, nitrogen radicals as well as hydrogen radicals to be generated through the formation of plasma using $N_2$ gas, $N_2+H_2$ gases, $N_2+NH_3$ gases, and $H_2+NH_3$ gases, may be utilized for the nitridation and the reduction. It is of course possible to employ dichlorosilane, disilane, etc. substituting for the $SiH_4$ gas.

(2) The formation of a $WSi_x$ barrier metal by means of the ALD method.

Next, a method of forming a $WSi_x$ barrier metal by means of the ALD method will be explained. Since the method of forming a $WSi_xN_y$ barrier metal is identical with the aforementioned process excepting the step shown in FIG. 6D, only the process to be performed in the step of FIG. 6D will be explained. In this step, a gas comprising at least refractory metal gas such as a $WF_6$ gas and a $SiH_4$ gas, and the same or different gas including at least III or V group element such as a $B_2H_6$ gas, $PH_3$ gas or $AsH_3$ gas are alternately introduced as process gases, through a separate channel, into the processing vessel, in which a barrier metal 14 having a predetermined thickness and consisting of a refractory metal film such as a $WSi_x$ film is allowed to deposit by means of the ALD (atomic layer deposition). It is also possible to employ Ar, $N_2$ and $H_2$ gases. In this case, the step of forming an ALD-$WSi_x$ film as shown in FIG. 7B is performed. Namely, a first step 76 for supplying a mixed gas comprising $WF_6$ gas and $SiH_4$ gas, and a second step 75 for supplying another gas comprising a $B_2H_6$ gas may be alternately repeated a plurality of times with a purging step 78 being interposed between these steps so as to evacuate the processing vessel while feeding thereto an inert gas such as Ar gas (of course it is possible in this case to perform only the evacuation without performing the purging). On the occasion of exchanging a kind of gas for a different kind of gas in each of the steps 76 and 75, the quantity of the residual gas of the previous step in the processing vessel 34 should preferably be reduced to a level of 1 to 30% based on the entire capacity of the processing vessel 34, or alternatively, a total quantity of the residual gas of the previous step which is kept free inside the processing vessel 34 plus the residual gas of the previous step which is adsorbed on the inner wall of the processing vessel 34 should preferably be reduced to a level of 1 to 30% based on the entire capacity of the processing vessel 34. Alternatively, the interior of the processing vessel 34 should preferably be evacuated to a vacuum degree of 0.1 Torr or so. When the interior of the processing vessel 34 is evacuated to such a level as described above, the residual materials of the previous step can be sufficiently removed for the next step. However, even if the residual materials of the previous step is left remained at a level of 1 to 30% based on the entire capacity of the processing vessel 34, the film (ultra-thin barrier metal constituted by a refractory metal silicon nitride) to be formed under such a condition would be sufficiently high in density as well as in barrier property, depending on the presence of any dead spaces for a gas in the processing vessel 34. Further, when an 8-inch wafer is used as the substrate 2a, the flow rate of each of the process gases should be: about 2 to 100 sccm, preferably 5 to 50 sccm for the $WF_6$ gas, about 10 to 300 sccm, preferably 10 to 150 sccm for the $SiH_4$ gas, and about 1 to 100 sccm, preferably 1 to 50 sccm for the $B_2H_6$ gas (in the case of the wafers having a diameter of more than 8 inches, the quantity of gas to be employed should preferably be at least one time as large as the quantity of gas to be employed for the 8-inch wafer, more preferably 1.5 to 6 times as large as the quantity of gas to be employed for the 8-inch wafer, the quantity of gas to be employed increasing in proportion to the capacity of the chamber). The process temperature should preferably be in the range of 200 to 500° C., more preferably about 300 to 450° C., and the process pressure should preferably be in the range of about 0.5 to 80 Torr, more preferably 1 to 20 Torr. The film-forming rate during one cycle should preferably be 1 to 200 angstroms/cycle, more preferably 1 to 50 angstroms/cycle.

In the embodiments, the kinds of process gas to be employed herein can be limited to only two kinds, thereby making it possible to extremely simplify the structure of the gas supply system. It is of course possible to employ dichlorosilane or disilane, substituting for the silane gas.

(3) Another method of forming a $WSi_x$ barrier metal by means of a nuclear layer forming process or method.

Next, another method of forming a $WSi_x$ barrier metal in two steps will be explained. In this case, upon finishing the step shown in FIG. 6C, a step of forming a WSi layer is performed at first in the processing apparatus shown in FIG. 5. As for the processing gas to be employed on this occasion, a gas comprising $WF_6$ gas, a gas comprising $SiH_4$ gas, and a gas comprising $B_2H_6$ gas are employed. These gases are individually and alternately supplied by making use of a carrier gas such as Ar gas, $N_2$ gas or $H_2$ gas to thereby enable a $WSi_xN_y$ film to be deposited on the substrate. In this case also, the WSi film is deposited to a predetermined thickness by means of the ALD (atomic layer deposition). Specifically, as shown in FIG. 7C, a first step 76 for supplying a gas comprising $WF_6$ gas, and a second step 75 for supplying a gas comprising $B_2H_6$ gas may be alternately repeated a plurality of times with a purging step 78 being interposed between these steps so as to evacuate the processing vessel while feeding thereto an inert gas such as Ar gas (of course it is possible in this case to perform only the evacuation without performing the purging). In the aforementioned method of forming the barrier metal shown in FIG. 7B, the $SiH_4$ gas functions as a reducing agent for reducing the $WF_6$ gas. In the method of forming the barrier metal using silane gas such as illustrated in FIG. 7B, if the flow rate of the $SiH_4$ gas supplied in the second step 75 is large, a WSi film is formed, and its flow ratio is small, a W film is formed. On the occasion of exchanging a kind of gas for a different kind of gas in each of the steps 75, 76, and 78 in this embodiment, the quantity of the residual gas of the previous step in the processing vessel 34 should preferably be reduced to a level of 1 to 30% based on the entire capacity of the processing vessel 34, or alternatively, a total quantity of the residual gas of the previous step which is kept free inside the processing vessel 34 plus the residual gas of the previous step which is adsorbed on the inner wall of the processing vessel 34 should preferably be reduced to a level of 1 to 30% based on the entire capacity of the processing vessel 34. Alternatively, the interior of the processing vessel 34 should preferably be evacuated to a vacuum degree of 0.1 Torr or so. When the interior of the processing vessel 34 is evacuated to such a level as described above, the residual materials of the previous step can be sufficiently removed for the next step. However, even if the residual materials of the previous step is left remained at a level of 1 to 30% based on the entire capacity of the processing vessel 34, the film (ultra-thin barrier metal constituted by a refractory metal silicon) to be formed under such a condition would be sufficiently high in density as well as in barrier property, depending on the presence of any dead spaces for a gas in the processing vessel 34. By the way, the flow rate of the processing gases, the process temperature and the process pressure in this method may be the same as those of the method illustrated in FIG. 7B.

If $NH_3$ gas is to be employed, it is preferable to perform the purging of the processing vessel 34 by making use of Ar gas or $N_2$ gas at an interval between the film-forming step and the nitridation step to thereby remove the $WF_6$ gas or the $NH_3$ gas. In particular, if $NH_3$ gas is to be employed in place of MMH gas in the nitridation step, it is preferable to remove the $WF_6$ gas prior to the nitridation process, because of the fact that if the $WF_6$ gas is permitted to remain inside the processing vessel, a side reaction product which can be hardly removed such as ammonium fluoride or a reaction product between ammonia and fluoride gas would be permitted to be produced. More specifically, the quantity of the residual gas of the previous step in the processing vessel 34 should preferably be reduced to a level of 1 to 30% based on the entire capacity of the processing vessel 34, or alternatively, the interior of the processing vessel 34 should preferably be evacuated to a vacuum degree of 0.1 Torr or so. When the interior of the processing vessel 34 is evacuated to such a level as described above, the residual materials of the previous step can be sufficiently removed for the next step. By the way, if $NH_3$ gas is to be employed, the process temperature should be set to within the range of about 300 to 450° C.

The nitridation step may be performed in such a manner that a gas comprising $N_2$ gas, $NH_3$ gas, MMH gas, $H_2$ gas or a mixed gas consisting of any combination of these gases is fed to the processing vessel, and then, a switch 52 is turned on to apply a high frequency power to the upper electrode (shower head portion) 48, to the lower electrode (mounting pedestal) 36, or to both of these electrodes, thereby allowing plasma to generate inside the processing vessel and hence supplying active nitrogen atoms to the processing vessel to perform the nitridation treatment. On this occasion, the quantity of the N-containing gas to be fed thereto should preferably be within the range of about 50 to 1000 sccm. As for the Ar gas, the quantity thereof should preferably be within the range of about 50 to 1000 sccm, and as for $H_2$ gas, the quantity thereof should preferably be within the range of about 200 to 1000 sccm. The process temperature should preferably be within the range of about 200 to 500° C., and the process pressure should preferably be within the range of 0.1 to 10 Torr.

The ultra-thin barrier metal 14 that has been formed according to each of the aforementioned methods was confirmed, as a result of the tests on the properties thereof, as capable of exhibiting a sufficient barrier property to oxygen atom or to metallic atoms.

Next, the polymetal gate electrode and the method of forming the gate electrode according to the present invention will be explained.

Figure 9:
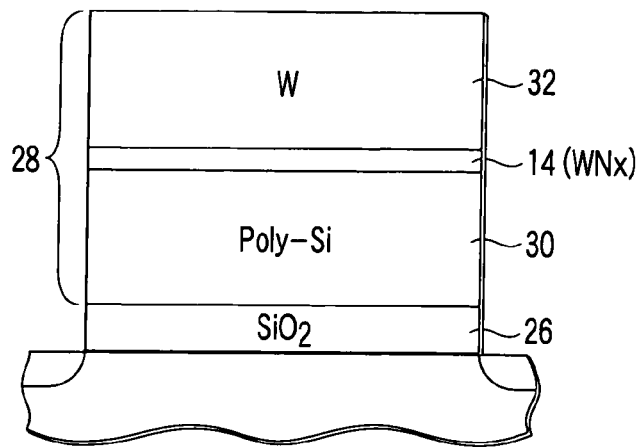
FIG. 9 is an enlarged sectional view showing a region of gate electrode shown in FIG. 3A.

Now, the gate electrode 28, which has been explained with reference to FIG. 3A will be explained more specifically. FIG. 9 is an enlarged view of the region of the gate electrode shown in FIG. 3A. In this case, one example wherein tungsten nitride ($WN_x$) or tungsten is employed as a material for the barrier metal 14 will be explained. As explained with reference to FIG. 3A, the source and drain regions 18 and 19 where conductive atoms are diffused are disposed on both sides of the gate oxide film 26 of the substrate 2a which is constituted by a semiconductor wafer made of monocrystalline silicon for instance. As a material for the gate oxide film 26, a silicon oxide film ($SiO_2$) 26 is employed in this embodiment.

The polysilicon layer 30 which is phosphorus-doped for instance is formed by means of a know method and by making use of a separate film-forming apparatus as described above. Thereafter, the resultant substrate W is transferred to the film-forming apparatus as shown in FIG. 5.

Figures 8A, 8B, 8C:
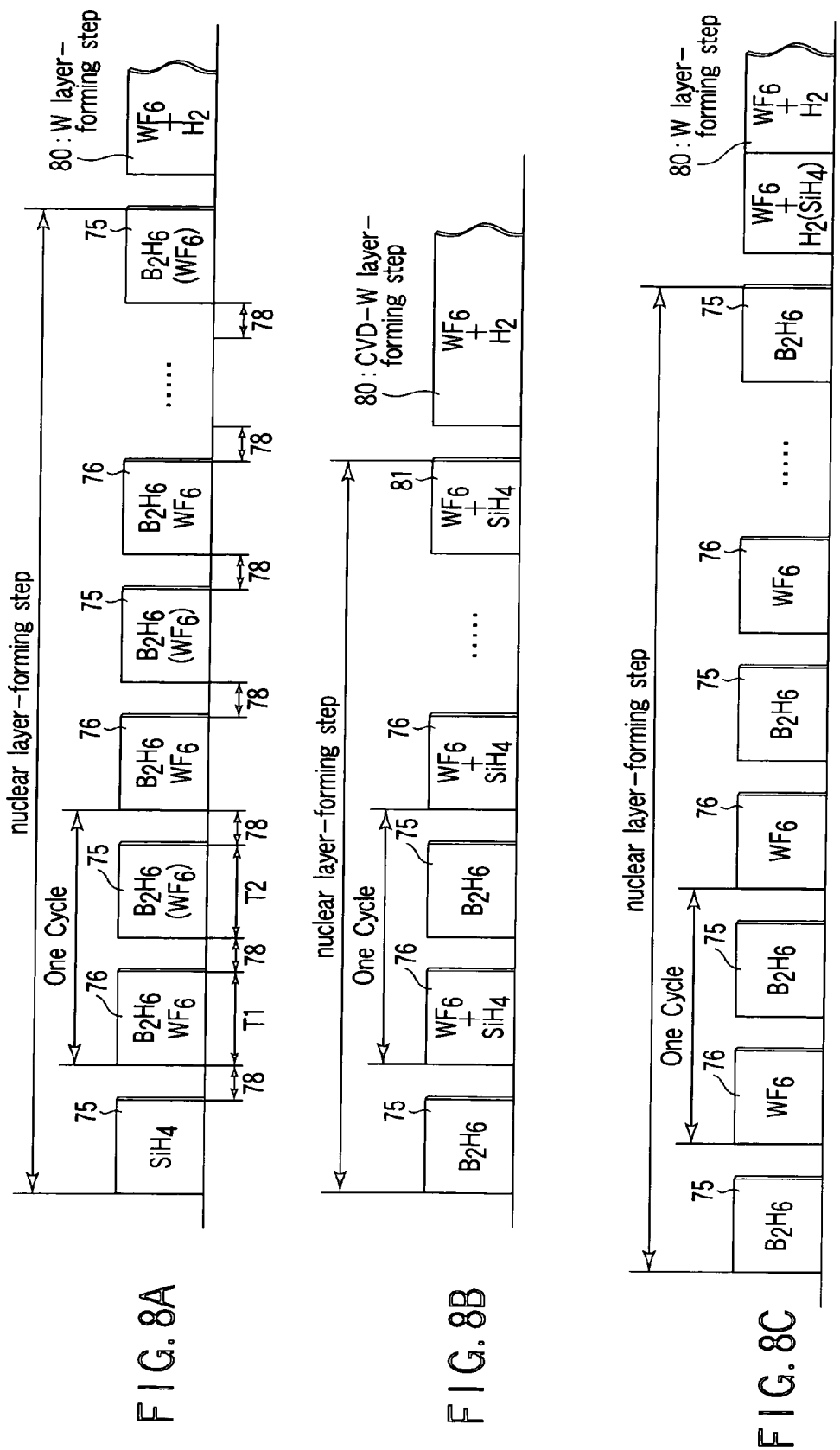
FIGS. 8A to 8C are time charts illustrating is another process for forming a barrier metal.

When it is desired to form a W film constituted by an ultra-thin barrier metal, as shown in FIG. 8A, an ultra-thin barrier metal 14 made of the W film is formed at first to a predetermined thickness on the surface of the polysilicon layer 30 by the nuclear layer-forming step as that shown in FIG. 7A. Thereafter, a tungsten layer 32 is formed on the barrier metal 14 inside the same processing vessel 34 (a W film-forming step 80). In this step of forming this tungsten layer 32, a thermal CVD method is employed using, as a processing gas, a mixed gas comprising $WF_6$ gas and $H_2$ gas, and at the same time, using Ar, $N_2$ and $H_2$ gases, thereby depositing a W film having a predetermined thickness, as shown in FIG. 8A. The thickness of each layer on this occasion is selected so as to conform with the design rule of the memory corresponding to the capacity of 1G bits for instance, i.e. about 20 angstroms for the gate oxide film 26, about 500 angstroms for the polysilicon layer 30, about 50 angstroms for the ultra-thin barrier metal 14 (deposited by means of the nuclear layer-forming step), and about 500 angstroms for the metallic layer (tungsten layer) 32. Thereafter, the main step of forming the W film (the step 80) is performed by making use of this nucleation film as an origin.

As the gate electrode 28 is formed in this manner, the oxide film 26, the polysilicon layer 30, the ultra-thin barrier metal 14 and tungsten layer 32 are sequentially formed. Since both of the ultra-thin barrier metal 14 (deposited by means of the ALD) and the tungsten layer 32 are formed of the same metallic material (i.e. tungsten) with each other, they can be successively deposited in the same film-forming apparatus, thus making it unnecessary to perform the operation of loading and unloading the substrate, and hence improving the productivity.

Further, since the W layer formed by means of the ALD and constituted by an ultra-thin barrier metal are formed in this manner for constituting the polymetal gate electrode, the electric resistance of the gate electrode can be extremely minimized, and the adhesivity between these layers as well as the heat resistance of these layers can be enhanced, thus enabling them to exhibit excellent barrier properties. In particular, since it is possible to retain such a sufficient barrier properties as described above even if the thickness of the barrier metal 14 is reduced to as thin as 50 angstroms or so, the barrier metal 14 is useful for enhancing the integration of semiconductor integrated circuit through the thinning and multi-layering thereof.

By the way, the steps of forming the gate electrodes wherein the ultra-thin barrier metals 14 to be formed by means of the nuclear layer-forming steps are formed of WSi and W respectively are shown in FIGS. 8B and 8C. In the method of FIG. 8B, an ultra-thin barrier metal 14 consisting of a $WSi_x$ film and to be formed by means of the ALD is formed to a predetermined thickness on the surface of the polysilicon layer 3 in the same ALD-$WSi_x$ film-forming step as illustrated in FIG. 7B. Thereafter, by making use of a gas comprising $WF_6$ and $H_2$, a tungsten layer 32 is formed on the surface of the ultra-thin barrier metal 14 formed by means of the ALD in the same processing vessel 34 (the W film-forming step 80). On the other hand, in the method of FIG. 8C, a nucleation film-forming process for W is performed at first using a $WF_6$ gas, the flow rate of which being smaller than that to be employed in a W layer-forming step 80 (for example, using $WF_6$ gas at a flow rate of 1 to 20 sccm) and then using $B_2H_6$. Thereafter, by making use of a gas comprising $WF_6$ and $H_2$, the main step of forming the W film (the step 80) is performed by making use of this nucleation film as an origin.

In the methods described with reference to FIGS. 7A to 7C and 8A to 8C, a silane group gas such as a silane gas may be additionally supplied before the initial first step (only one initial step of a plurality of first steps) is made. Further, a silane group gas such as a silane gas may be additionally supplied after the nuclear layer forming step and before the W layer forming step 80 in the process shown in FIGS. 8A to 8C.

Figure 10A:
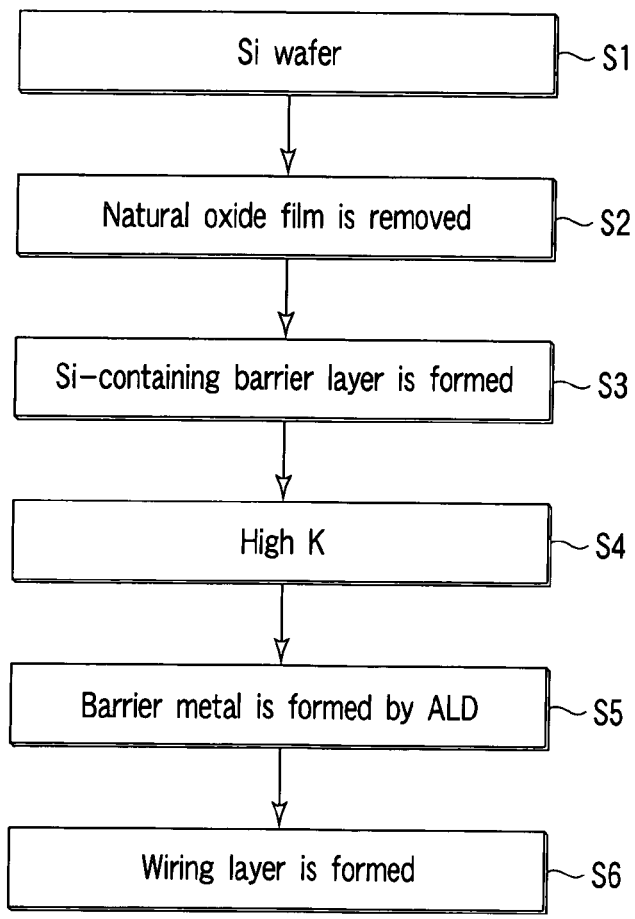
FIGS. 10A to 10C are flow charts each illustrating one example of process for forming a gate electrode.
Figure 10C:
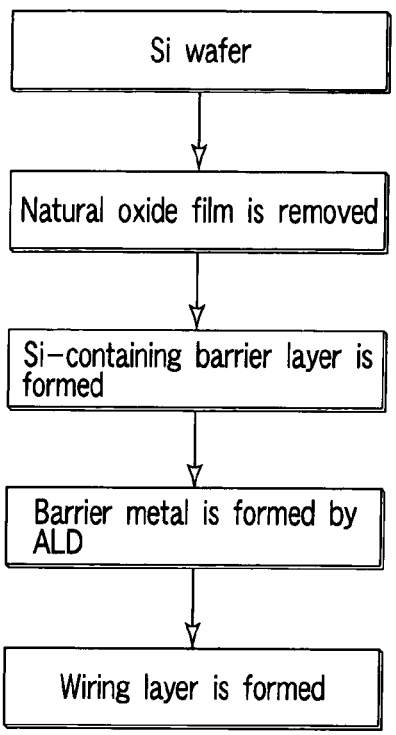
Figure 10B:
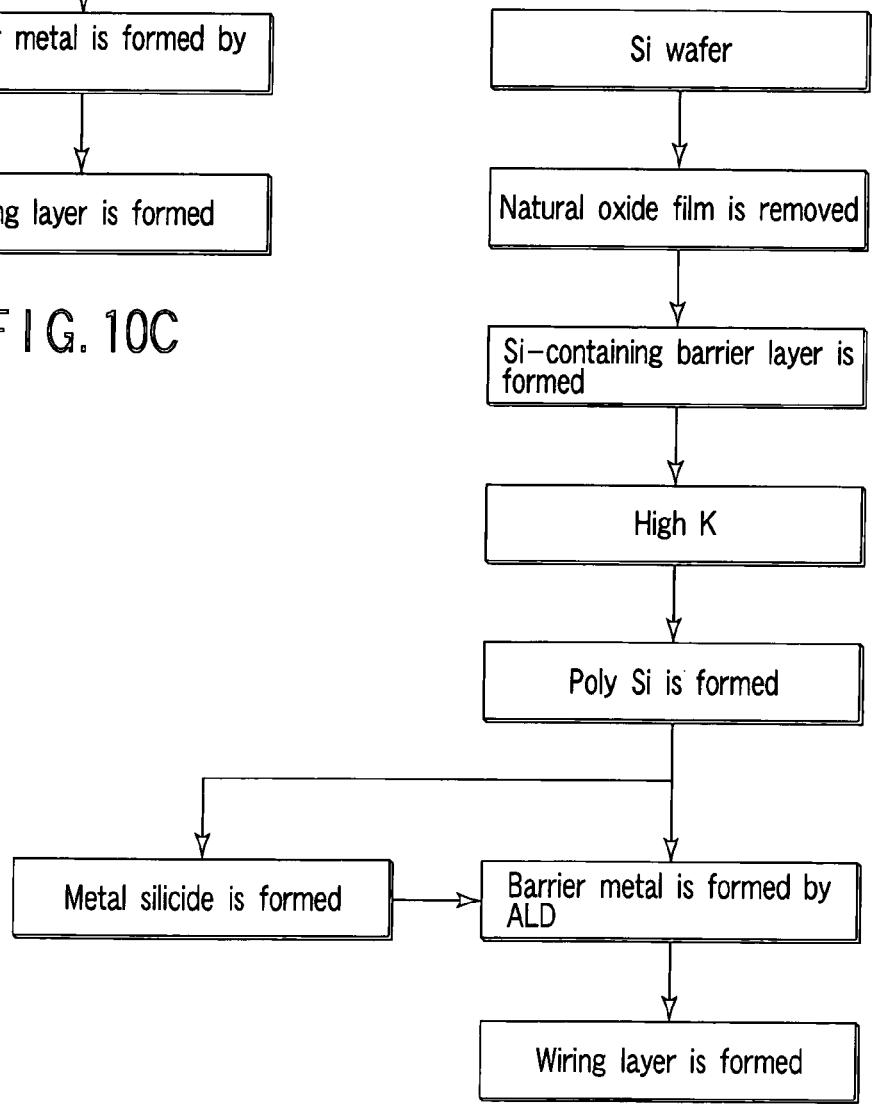

Next, one example of the metal gate electrode-forming method illustrated in FIG. 3B will be explained with reference to FIG. 10A.

Figure 11:
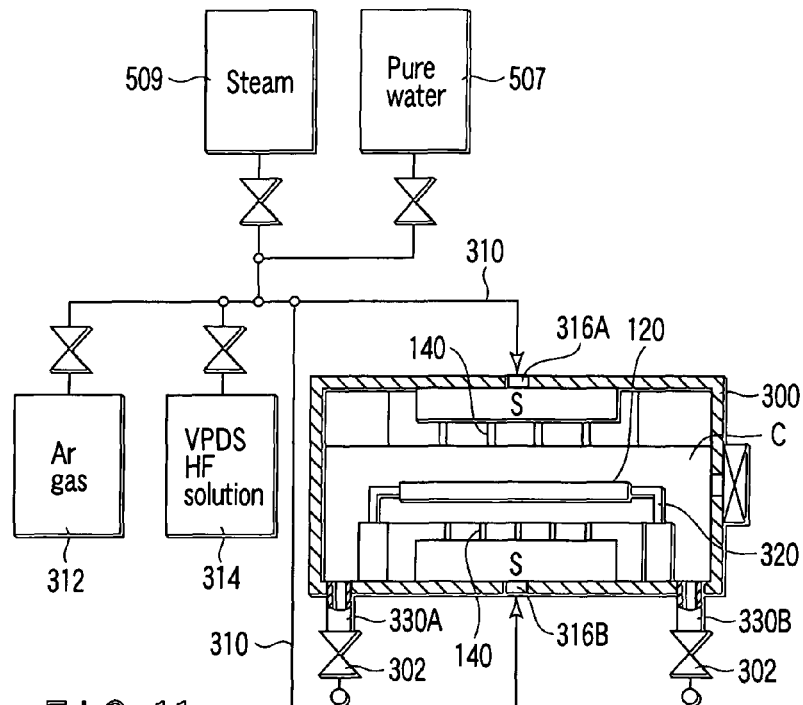
FIG. 11 is a schematic view showing one example of a natural oxide film-eliminating apparatus.

First of all, a Si wafer 120 is prepared (step S1), and the natural oxide film formed on the surface of the Si wafer 120 is removed (step S2). According to an ordinary method of removing the natural oxide film formed on the surface of wafer, by making use of a prescribed wet cleaning apparatus, the wafer is dipped in a mixed solution consisting, for example, of hydrofluoric acid and water (1% HF solution) to thereby remove the natural oxide film. It is also possible to employ another method wherein a hydrofluoric vapor phase natural oxide film-removing apparatus (HF Vapor Phase Decomposition System (VPDS)) which is disclosed in U.S. Pat. No. 5,474,641 (invented by the present inventor) is mounted oh a cluster tool to thereby continuously perform the removal of natural oxide film and the formation of film. This natural oxide film-removing apparatus is constructed as shown in FIG. 11. Namely, a vessel 300 is provided with gas supply ports 316A and 316B, to each of which an HF gas source 314 and an Ar gas source 312 are connected through a gas supply line 310. Further, the vessel 300 is also provided with exhaust ports 330A and 330B, to each of which an exhaust system (not shown) is connected through exhaust valves 302. Moreover, the gas supply ports 316A and 316B are respectively connected with a cleaning gas inlet portion comprising a diffusion space S and a large number of cleaning gas discharge ports 140, and communicated with a processing chamber C formed inside the vessel 300. This chamber C is provided therein with a supporting mechanism 320 having a substrate-rotating mechanism, thereby enabling the wafer 120 to be supported by the supporting mechanism 320. If a natural oxide film is to be removed by making use of this natural oxide film-removing apparatus, a gas comprising HF vapor gas (vaporized gas with HF solution) is introduced at first, via the gas supply line 310, into the chamber C from the HF vapor gas source 312 with the exhaust valve 302 being kept closed. When the chamber C is filled with a predetermined quantity of the gas comprising HF vapor gas, the supply of the gas comprising HF vapor gas is stopped, and the resultant state is allowed to maintain for a predetermined period of time (for example, 5 to 300 seconds). As a result, the natural oxide film is caused to decompose by the gas containing HF vapor gas. The residual materials thus decomposed and remaining on the surface of the wafer 120 are caused to rotate by the rotating function of the supporting mechanism, the exhaust valve 302 is opened, and an Ar gas (or $H_2$, $N_2$, He gas) is supplied from an Ar gas source 314 into the chamber C, thereby allowing the residual materials on the surface of the wafer 120 as well as the HF vapor-containing gas existing inside the chamber C to be discharged therefrom. By repeating the aforementioned processes, it is possible to effectively remove the natural oxide film and hence to permit a clean Si surface (preferably, a Si surface which is terminated with hydrogen atom) to be exposed on the surface of wafer. By the way, in FIG. 11, reference number 509 denotes a steam supply source for cleaning after VPDS HF process. Reference number 507 also denotes a pure water supply source for cleaning after VPDS HF process.

Figure 12:
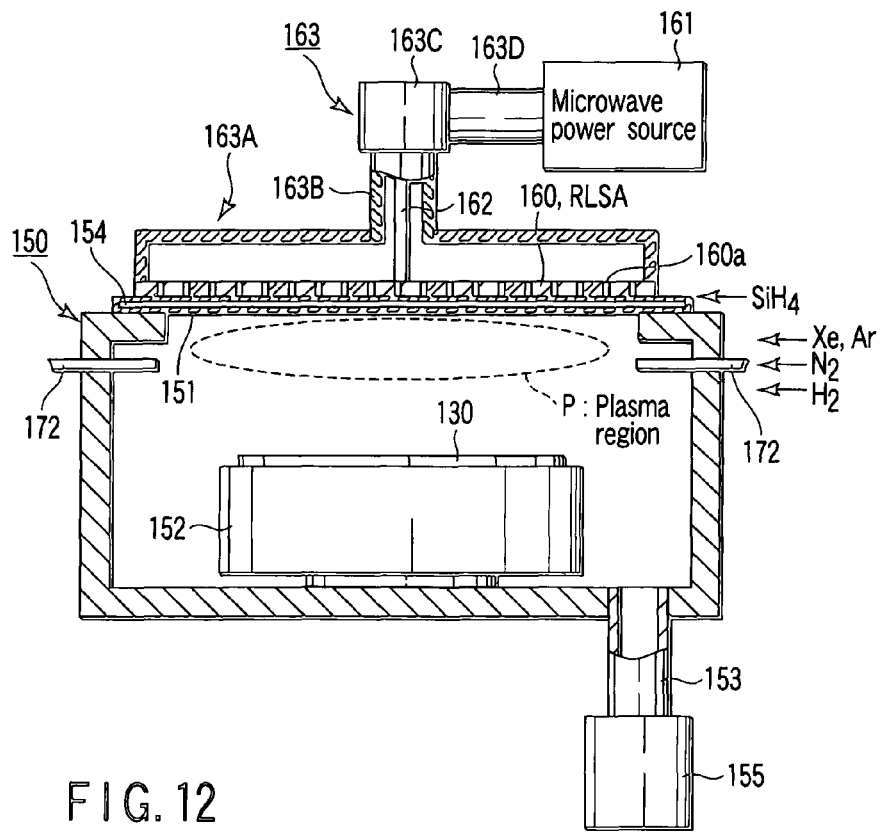
FIG. 12 is a schematic view showing one example of an apparatus to be employed in the oxidizing/nitriding step of a Si wafer.

As an alternative method, the natural oxide film formed on the surface of the wafer 120 can be removed by making use of a plasma which is damageless to the substrate, or a microwave plasma to be generated using a plane antenna provided with a plurality of slits for instance. A chamber in an apparatus for generating the plasma need to have a clean inside-space without impurity causing deterioration of property of elements. One example of the apparatus for realizing the aforementioned method is shown in FIG. 12. Specifically, Ar gas and $H_2$ gas are introduced into the chamber of the apparatus, thereby allowing plasma to generate. As a result, the natural oxide film $SiO_2$ formed on the surface of wafer is reduced by the H radicals generated in the plasma at the same time, etched by the Ar ion to remove the natural oxide film. Since the microwave plasma to be generated using a plane antenna is very low in electron density of plasma, i.e. 1 eV or less, the plasma sheath voltage to be generated between the plasma the surface of wafer is as very low as several volts (if this voltage is too high, the ion is accelerated to give a damage to the substrate. Whereas the parallel plate type high-frequency plasma is 50 eV or so in plasma sheath voltage). Therefore, the natural oxide film formed on the surface of wafer can be removed without the surface of wafer being damaged by the Ar ion, thereby enabling a clean Si surface (a Si surface which is terminated with hydrogen atom) to be exposed on the surface of wafer.

After finishing the removal of redundant natural oxide film formed on the surface of the wafer 120 as described above, the wafer 120 is transferred to an ultra-thin Si-containing barrier seed layer-forming device by making use of the same apparatus as shown in FIG. 12. Then, $O_2$ gas or $N_2$ gas for example is introduced into the apparatus to generate microwave plasma, thereby enabling the surface of the Si wafer 120 to be directly oxidized or nitrided, thus forming an SiO$_2$ film 121, an Si$_x$N$_y$ film or a silicon oxynitride film on the surface of the Si wafer 120 (step S3). Alternatively, the SiO$_2$ film may be formed by making use of O$_3$ gas or O$_2$ gas while employing an ultraviolet lamp in place of the microwave plasma. The SiN film may be formed by making use of N$_2$ gas or NH$_3$ gas while employing an ultraviolet lamp. The silicon oxyfilm may be formed by making use of a gas selected from the group consisting of N$_2$O gas, NO gas, N$_2$ gas+O$_2$ gas and/or O$_3$ gas, and NF$_3$ gas+O$_2$ gas and/or O$_3$ gas, while employing an ultraviolet lamp. Herein, one example where an SiON film constituted by an ultra-thin Si-containing barrier seed layer is formed by making use of the apparatus shown in FIG. 12 using microwave will be explained.

First of all, a wafer 130 is mounted on a mounting pedestal 152. Then, the gate valve is closed to close the interior of a vacuum vessel 150, after which the inner atmosphere of the vacuum vessel 150 is discharged through an exhaust pipe 153 by means of a vacuum pump 155 to evacuate the interior of the vacuum vessel 150 to a predetermined vacuum degree. Thereafter, the aforementioned processing gas is introduced into the vacuum vessel so as to maintain a predetermined pressure. On the other hand, a microwave of 2.45 GHz (3 kW) for instance is permitted to generate from a microwave power source 161 and introduced, as guided by a wave-guide means 163, into the vacuum vessel 150 through a radial line slot antenna (RLSA) 160 which is made of copper for instance and through a gas supply chamber 154, thereby enabling plasma to generate at a plasma region P which is located at an upper portion of the vacuum vessel 150. As for the frequency of the microwave, it may be in the range of 1 to 20 GHz. As for the electric power, it may be in the range of 1 to 10 kW.

In this case, the microwave is transmitted as a rectangular mode through a rectangular wave-guide 163D of the guide means 163 and subsequently, converted into a circular mode at a coaxial-to-waveguide transducer 163C. Thereafter, this microwave of circular mode is transmitted through a cylindrical coaxial waveguide 163B, expanded at a circular waveguide 163A and emitted from the slots 160a of the RLSA 160, thereby enabling the microwave to be introduced through a first gas supply portion 154 into the vacuum vessel 150.

Then, the pressure inside the vacuum vessel is set to fall within the range of 0.1 mTorr to 1 Torr, and the temperature of the mounting pedestal 152 is adjusted so as to heat the wafer 130 at a temperature ranging from 20 to 500° C., during which Ar gas, N$_2$ gas, H$_2$ gas and O$_2$ gas are introduced, as processing gases, from a second gas supply portion 172 into the vacuum vessel at flow rates of 50 to 5000 sccm, 10 to 500 sccm, 10 to 200 sccm and 0.1 to 100 sccm, respectively, preferably at flow rates of 500 to 2000 sccm, 25 to 100 sccm, 15 to 50 sccm and 1 to 10 sccm, respectively. By the way, these processing gases may be introduced through the first gas supply portion 154. As plasma gas, Ne gas, He gas, Kr gas, Xe gas may be introduced.

The gases introduced in this step are activated (radicalization) by the plasma flow that has been generated in the vacuum vessel 150, thereby enabling the activated oxynitrogen in this plasma to react with the Si constituting the surface of the wafer 130 to oxynitride the surface of the wafer 130, thus forming an SiON film. The activated hydrogen in the plasma in this case is effective in suppressing the generation of sputtering from the surface of the wafer 130, thereby enhancing the efficiency of the oxynitridation of Si. When this oxynitridation of Si is performed for a period ranging from 1 to 30 seconds, an ultra-thin Si-containing barrier seed layer constituted by an SiON film and having a thickness of 0.1 to 3 nm can be formed.

By the way, it is possible in this case to introduce N$_2$O gas and NO gas into the vacuum vessel in place of aforementioned N$_2$ gas and O$_2$ gas. Further, NH$_3$ gas may be employed in place of N$_2$ gas. If an SiO film is to be formed, it can be formed using an inert gas, H$_2$ gas and O$_2$ gas. Further, if an SiON film is to be formed, a thermal SiO$_2$ film which has been formed in advance on the surface of wafer may be nitrided by making use of the aforementioned nitriding gas in microwave plasma to thereby form the SiON film. Alternatively, an oxidizing treatment and a nitriding treatment may be alternately applied to a Si substrate to thereby form the SiON film.

It is also conceivable to form an ultra-thin SiN film on the surface of the aforementioned ultra-thin Si-containing barrier seed layer so as to enhance the barrier property of the barrier seed layer for preventing the diffusion of metallic atom or oxygen atom which are contained in the overlying layer. The method of forming such an ultra-thin SiN film can be executed as follows. First of all, the wafer 130 is taken out of the vacuum vessel 150 and transferred to a separate plasma processing unit (not shown). Then, while maintaining the conditions of the interior of the processing unit at such ranges that, for example, 200 to 500° C. in the temperature of the wafer 130 and, for example, 0.1 mTorr to 1 Torr in the process pressure, SiH$_4$ gas is introduced through the first gas supply portion 154 into the processing chamber at a flow rate of 15 sccm to 100 sccm, and at the same time, Xe gas (alternatively, it may be Ar or He) and H$_2$ gas are respectively introduced from the second gas supply portion 172 at a flow rate of 500 to 2000 sccm and 20 to 200 sccm, respectively, thereby generating plasma. As a result of this process, the gases thus introduced are caused to dissociate, decompose and react with Si by the effects of the plasma, thereby enabling an ultra-thin SiN film to be deposited on the SiO$_2$ or SiON film of the ultra-thin Si-containing barrier seed layer formed on the wafer 130. As for the source of plasma, it may be RF plasma, remote plasma or microwave plasma. NH$_3$ gas may be used instead of N$_2$ gas.

Next, a ferroelectric film (dielectric constant: 5-30) consisting of a High K material (high dielectric material) such as Al$_2$O$_3$, ZrO$_2$, HfO$_2$, IrO$_2$, Ta$_2$O$_5$, SBT, PZT, ZrSi$_x$O$_y$, Hf$_x$-Si$_x$O$_y$, La$_2$O$_3$, Gd$_2$O$_3$, RuO and Pr$_2$O$_3$ is deposited on the surface of the ultra-thin Si-containing barrier seed layer by means of a prescribed apparatus (such as a sputtering apparatus, a CVD apparatus, etc.) (step S4). More specifically, if an Al$_2$O$_3$ film is to be formed for instance, TMA (trimethyl aluminum) and water (steam or water vapor) are alternately fed to thereby deposit the Al$_2$O$_3$ film. By the way, the High K materials may be formed by means of the ALD method.

Upon finishing the aforementioned process, an ultra-thin barrier metal 14 constituted by a refractory metal film or a refractory metal silicon film, for example, W or WSi is formed by means of the ALD (atomic layer deposition) (the cycle of FIGS. 7A to 7C is repeated) as mentioned above (step S5). Then, a W film 124 is deposited thereon (step S6). Specific examples of the gate electrode layer structures formed as mentioned above are respectively shown in FIGS. 13A and 13B. In these figures, a reference numeral 171 represents a gate insulating film such as an SiO$_2$ film on the upper surface 171a of which is nitrided, 14 is an ultrathin barrier metal made of a refractory metal film or a refractory metal silicon film, and 124 is a W thick film. Further, in FIG. 13A, an impurity-doped polysilicon film 172 is formed between the films 14 and 171a. Alternatively, in FIG. 13B, a nitrided High K film 173 made of one of the aforementioned High K materials is formed between the films 14 and 171*a*. The upper surface 173*a* of the High K film 173 is nitrided.

When the W thick layer 124 for constituting a wiring layer is to be formed on the surface of the barrier metal layer, it is preferable to form a nucleation film of W at first, the main W film being subsequently allowed to grow by making use of this nucleation film as an origin. However, the nucleation film of W may be omitted, and hence the W film may be directly formed on the surface of the ultra-thin barrier metal 14 formed by means of the ALD. Further, if both of the ultra-thin barrier metal 14 and the W film are formed by means of the ALD method, they can be formed according to the method shown in FIGS. 7A to 7C or FIGS. 8A to 8C.

The gate electrode according to the present invention and the ordinary gate electrode according to the prior art are evaluated on their properties, the results being shown in FIG. 14.

In FIG. 14, Comparative Examples 1 and 2 represent the conventional gate electrodes. As clearly seen from FIG. 14, Examples 1-6 of the present invention are excellent not only in both electric resistance and heat resistance which are important characteristics for the gate electrode, but also in both response speed and leakage current. Whereas, in the case of Comparative Example 1, although it is excellent in heat resistance, the electric resistance thereof which is a very important feature is considerably large and the response speed thereof is also slow, and hence the Comparative Example 1 is not preferable. In the case of Comparative Example 2 also, the electric resistance thereof is large and the response speed thereof is also slow, and hence the Comparative Example 2 is not preferable. Therefore, the semiconductor device to be manufactured by making use of the ultra-thin barrier metal formed by means of the ALD according to the present invention is useful in enhancing the integration and operation speed of the device to be manufactured in future.

In the foregoing embodiments, the explanation thereof has been made taking one example wherein the gate oxide film 26 is constituted by a thermal $SiO_2$. However, the present invention is not limited to such embodiments, and hence the gate oxide film 26 may be constituted by an $SiO_2$ film or an SiON film which can be formed by exposing the surface of aforementioned Si substrate to activated oxygen and/or activated nitrogen so as to oxidize, nitride or oxynitride the surface of aforementioned Si substrate, or constituted by an oxide film which can be obtained by depositing a High K film on the surface of the aforementioned $SiO_2$ film or SiON film, the High K film being selected from tantalum oxide ($Ta_2O_5$), IrO, SBT, PZT, $ZrSi_xO_y$, $HfSi_xO_y$, $HfO_2$, $ZrO_2$, $La_2O_3$, $Pr_2O_3$, $Ga_2O_3$, etc.

In the formation of the ultra-thin barrier metal film, the W or $WSi_x$ which are to be employed in the aforementioned ALD according to the examples of the present invention can be removed, as in the case of other main films, by way of dry cleaning wherein a gas comprising $ClF_3$ gas is introduced into the chamber. When a redundant film that has been adhered onto the inner wall of the chamber is removed by way of dry-cleaning every moment after finishing the film-forming process of a suitable number of wafers (for example, one lot (25 sheets)), the generation of particles can be suppressed due to the removal of redundant film that has been adhered onto the inner wall of the chamber, thereby making it possible to form a film of excellent quality.

In the embodiments of the present invention, the explanation thereof has been made taking one example wherein tungsten was employed as a refractory metallic material for the ultra-thin barrier metal constituted by a refractory metal film or a refractory silicon film. However, the present invention is not limited to such embodiments, and hence it is possible to employ, for example, molybdenum (Mo), Ti, Ta, Co, Zu, Hf, Nb, Ni, La, Ga, Pr, etc. as a refractory metallic material for the ultra-thin barrier metal. Further, in the foregoing embodiments, the explanation thereof has been made taking one example wherein a semiconductor wafer was employed as a substrate. However, the present invention is not limited to such embodiments, and hence it is of course possible to employ, for example, an LCD substrate, a glass substrate, compound semiconductor substrate, etc. as the substrate.

Further, the embodiments of the present invention may be modified such that the processing gas may be introduced in the form of vapor phase pulses into the processing space. In this case, this processing step may comprise a step of evacuating a reaction space between two successive vapor phase pulses by connecting the reaction space to a pump so that substantially all of the reactants remaining in the reaction space and adsorbed on the inner walls of the reaction space are removed to a level of less than 1-30% prior to the inflow of a second pulse of said two successive vapor phase pulses; and a step of feeding an inactive gas into the reaction space simultaneous with the evacuating step.

The ultra-thin barrier metal is formed by means of ALD, using $WF_6$ gas, in the foregoing embodiments of the present invention. Nonetheless, W and $WSi_x$ may be formed by using carbonyle metal gas such as hexacarbonyl tungsten ($W(CO)_6$). In this case, the step 76 (FIGS. 7 and 8) of feeding $WF_6$ gas are replaced by the steps of feeding gas containing $W(CO)_6$. If $WF_6$ gas or the like is utilized, the fluorine atoms will diffuse into the lower layers and damage the lower layers. By contrast, if hexacarbonyl tungsten ($W(CO)_6$) is used, no lower layers will be damaged by the fluorine atoms. In view of this, the use of hexacarbonyl tungsten ($W(CO)_6$) is advantageous.

The present invention differs from the invention disclosed in U.S. Pat. No. 6,015,590. As pointed out above, the specification of U.S. Pat. No. 6,015,590 asserts that at least 99% of the residual gas should be removed for forming a thin film effectively. In fact, however, almost the same effect as attained in U.S. Pat. No. 6,015,590 can be obtained even if the residual gas is permitted to remain in a processing chamber at a ratio of 1 to 30% as in the present invention. The apparatus disclosed in the U.S. patent specification is designed to minimize both the volume and the cross-section of the piping. The method according to the present invention can achieve almost the same effect as the invention disclosed in the U.S. patent, though it uses a CVD chamber of ordinary structure.

In addition, the apparatus of the U.S. patent is designed not to have any dead space where the gas can hardly purged. Generally, projecting components exist in the conventional chambers. In the chambers, pipes and the like give rise to dead spaces. The method according to the present invention can form thin films by means of ALD, even if the chamber has dead spaces.

Moreover, in the apparatus of the U.S. patent, which is designed to reduce the volumetric capacity of the chamber as much as possible, the gas inevitably spreads, forming a substantially planar flow pattern, or a "flat" flow pattern. By contrast, the method according to the present invention can use the conventional CVD apparatus that forms gas streams of down flow.

Moreover, in the foregoing embodiments of the present invention (see FIG. 10A), a ferroelectric film consisting of a High K material (high dielectric material) is deposited on the surface of the ultra-thin Si-containing barrier seed layer. In this case, specifically in case that oxide-dielectric film such as $Ta_2O_5$ is deposited on the surface of the ultra-thin Si-containing barrier seed layer, a depletion of oxygen in the dielectric film occurs so that the crystal structure become unstable. This causes any leak current. To prevent this, it is needed to produce any active oxygen while irradiating ultraviolet ray, thereby striking the active oxygen to the dielectric film to decrease depletion of oxygen in the dielectric film. For this purpose, annealing is achieved at a temperature ranging from 300 to 700° C. for 1-30 minutes, preferably for 3-15 minutes under the atmosphere of a gas containing oxygen or ozone, while irradiating ultraviolet ray to produce any active oxygen. In this case, the temperature of a substrate is 300° C.-800° C., preferably 400° C.-700° C., the concentration of $O_3$ is 2-10%, preferably 5-8% and the illumination of UV ray is 100-500 mw/cm². As for the UV lamp, it may be an excimer lamp or a mercury lamp. The gas containing oxygen may be formed from plasma such as ICP or RLSA. The ozone may be formed from the gas containing oxygen by a ozone-generating apparatus (In general generating step of $O_3$, small quantity of $N_2$ gas is added (for example, in quantities of 1% of quantities of $O_2$ gas) as impurity gas. In this case, NOx gas is produced so that environment may be polluted). In this case, Addition gas such as inert gas or mixed gas comprising inert gas and $H_2$ gas is used to improve the rate of generating of $O_3$ generated by the ozone-generating apparatus. As for inert gas, it may be Ar gas, $N_2$ gas, Ne gas, Kr gas or Xe gas. The addition gas may be introduced in extremely small quantities, for example, in quantities not more than 1% of quantities of the gas containing oxygen, preferably in quantities not more than 0.5% of quantities of the gas containing oxygen, more preferably in quantities not more than 0.1% of quantities of the gas containing oxygen, thereby suppressing generation of $NO_x$.

Next, there will be described examples of apparatus for performing a method for forming a film according to the present invention.

Figure 15:
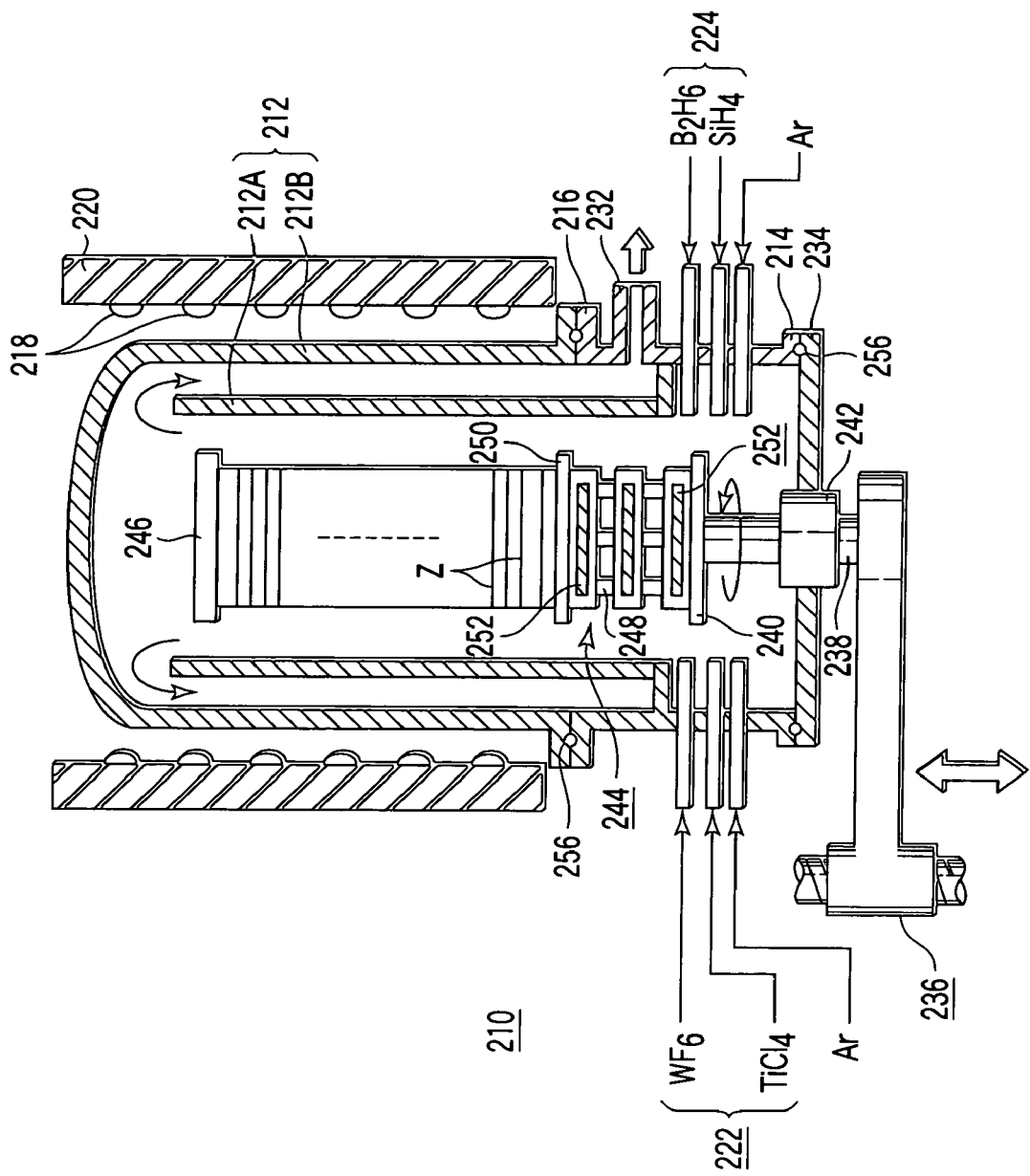
FIG. 15 is a schematic view showing an example of an apparatus suitable for performing a method of the present invention.

An apparatus shown in FIG. 15 includes a cylindrical processing container or vessel 212 made of quartz. The container 212 has a top wall for covering its top end, and a bottom open end. The container 212 is constructed by an inner cylinder 212A and an outer cylinder 212B which are coaxial with each other to constitute a double cylindrical construction. The bottom end of the container is coaxially connected to a manifold 214 made of stainless by outer flanges 216 abutted to each other so that the container is mounted and supported on the manifold. The manifold 214 has a cylindrical shape with top and bottom open ends. The outer peripheral wall of the process container 212 is enclosed by a cylindrical heat-insulator 220 on the inner peripheral surface of which is provided a heater of a coil shape, and thus a heating furnace is constructed.

A gas supplying means is provided to the manifold for supplying various gases into the inner cylinder 212A through the manifold. The gas supplying means is mainly constructed by a first gas supplying means 222 and a second gas supplying means 224. Each of the first and second gas supplying means 222 and 224 includes gas sources, gas supplying nozzles penetrating the manifold, and gas supplying lines respectively connecting the gas sources to the gas supplying nozzle and provided with on-off valves and mass flow controller. Thus gases stored in the gas sources may be selectively supplied into the container 212. For example, the gas sources of the first gas supplying means 222 respectively store $WF_6$ gas, $TiCl_4$ gas and Ar gas, and those of the second gas supplying means 224 contain $SiH_4$ gas, $B_2H_6$ gas and Ar gas. In the case of using a process gas from a liquid phase, its gas source may be constructed by a container for storing liquid of a process gas, and an evaporator for converting the processing material to a gas phase from a liquid phase, and the gas supplying line may be covered with a heat insulator or a heater such as a tape heater to maintain a gas state in the supplying line.

An exhaust port 232 is provided at the bottom end portion of the outer cylinder 212B to outwardly exhaust gases in the inner cylinder 212A through a circular space between the inner and outer cylinders. The exhaust port is connected to ah exhaust provided with a vacuum pump (not shown).

A bottom cap 234 is connected to the bottom end of the manifold 214 to cover and seal the bottom opening of the manifold with a seal O-ring 256 provided between the cap 234 and manifold. The cap 234 is mounted on a elevating mechanism 236 to be movable up and down between load and unload positions. The elevating mechanism includes a rotatable shaft 238 vertically extending through a central hole of the cap 234 and a table 240 attached to the top end of the shaft 238. A magnetic liquid type seal 242 is provided in the central pole between the middle portion of the shaft and cap. A cylindrical mechanism 244 for keeping warm is mounted on the table 240. The mechanism is constructed by three quartz heat radiating plates 250 which are connected to each other by a plurality of quartz supporting rods 248. Each of the heat radiating plates 250 is provided with an auxiliary resistive heater 252 as a preheating means buried therein. The heater 252 heats the entire cylindrical mechanism 244 at a predetermined temperature thereby allowing a space around the mechanism to for a preheated space 254. A means for supporting substrates to be processed such as a wafer boat 246 is mounted on the warm keeping member 244. The wafer boat 246 is made of quartz and supports a plurality of semiconductor wafers which are spaced in a predetermined pitch.

An apparatus of another example shown in FIG. 16 includes a processing container 301 having flat top and bottom walls and a circular or rectangular side wall. A substrate 302 on which a metal film is to be formed, is horizontally supported on a pedestal 320 mounted on the bottom wall within the container 301. The pedestal has a heater 321 therein for heating the substrate mounted on the pedestal A first gas supplying port or nozzle 303A is provided to penetrate the side wall of the container on first or one side. A first gas exhaust port 304A is provided in the bottom wall of the container 301 near the second or opposite side, so that the substrate 302 is positioned between the gas supply and exhaust ports 303A and 304A. A second gas supplying port or nozzle 303B is provided to penetrate the side wall of the container on the second or opposite side. A second gas exhaust port 304B is provided in the bottom wall of the container 301 near the first or one side, so that the substrate 302 is positioned between the second gas supply and exhaust ports 303B and 304B. The first and second nozzle 303A and 303B are horizontally positioned in alignment and opposed with each other, and directed to a space on the substrate 302.

The first gas supplying port 303A is connected to a first gas source means through a first on-off valve 305A. The first gas source means may be constructed by a plurality of first gas sources and on-off valves and mass flow controllers respectively connected to the gas sources. The first gas sources includes a source for a process gas such as a gas containing refractory metal, for example, an HTB gas or $WF_6$ gas and a source for a carrier gas such as an Ar gas. The second gas supplying port 303B is connected to a second gas source means through a second on-off valve 305B The first gas source means may be constructed by a plurality of first gas sources and on-off valves and mass flow controllers respectively connected to the gas sources. The second gas sources includes a source for a process gas such as a silane group gas, for example, a $SiH_4$ gas and/or a $B_2H_6$ gas, a gas source for an $O_2$ gas, and a source for a carrier gas such as an Ar gas.

The first gas exhaust port 304A is connected to a first exhaust line including a first control valve 306A and a vacuum pump (not shown). Similarly, the second gas exhaust port 304B is connected to a second exhaust line including a second control valve 306B and a vacuum pump (not shown).

In the aforementioned apparatus, each of the first and second nozzles and exhaust ports preferably has a flat rectangular opening in such a manner that the process gas flow on the upper surface of the substrate in an even laminar flow.

The apparatus shown in FIG. 16 is operated as follows.

In a first step, the first on-off valve 305A and exhaust valve 306A are opened, while the second on-off valve 305B and exhaust valve 306B are closed. Thus only the first gas source means is operated to introduce the first process gas with the carrier gas into the container 301, so that the first process gas is absorbed in upper surface of the substrate 302. The residual gas is exhaust from the first exhaust port 304A as shown by an arrow A. Next, the first on-off valve 305A is closed, or the on-off valve of the first process gas is closed in a predetermined period, so that the inside of the container 301 is evacuated or purged with the Ar gas (purging step). In the following second step, the second on-off valve 305B and exhaust valve 306B are opened, while the first on-off valve 305A and exhaust valve 306A are closed. Thus only the second gas source means is operated to introduce the first process gas with the carrier gas into the container 301. In this case one of the on-off valves of the second process gas and the $O_2$ gas is closed, so that the second process gas or $O_2$ is reacted with or oxidizes the first process gas absorbed in upper surface of the substrate 302 to form a refractory metal film on the substrate. The residual gas is exhaust from the second exhaust port 304B in a direction opposite to the direction of the arrow A. Finally, the purging step is again performed, so that a first cycle is finished.

Then, the cycles each including or consisting of the first step, purging step and second step are repeated to form a film of a predetermined thickness.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a refractory metal film doped with at least one of III or V group elements, using an apparatus comprising (i) a processing vessel, (ii) a supporting member which is provided in the processing vessel and supports a substrate, (iii) a heater which heats the substrate supported by the supporting member, (iv) a gas supply mechanism for supplying gases towards the substrate in the processing vessel, (v) an evacuating mechanism for evacuating the processing vessel, (vi) a first gas source for storing a first gas including refractory metallic atoms, (vii) a second gas source for storing a second gas including at least one of III or V group elements, (viii) a third gas source for storing an inert gas, and (ix) first to third gas introducing pipes for selective fluid communication between the first to third gas sources and the gas supply mechanism, the method comprising:

supplying the first gas from the first gas source through the first gas introducing pipe and through a first port inside the gas supply mechanism toward the substrate within the processing vessel;

supplying the second gas from the second gas source through the second gas introducing pipe and through a second port inside the gas supply mechanism toward the substrate within the processing vessel, wherein the first and second ports in the gas supply mechanism comprise separate gas spray ports dispersing respectively the first and second gases from the gas supply mechanism from different ports;

purging the processing vessel by evacuating the processing vessel by the evacuating mechanism, while supplying the inert gas from the third gas source through the third gas introducing pipe and through the gas supply mechanism into the processing vessel, while the processing vessel is evacuated by the evacuating mechanism to exhaust the inert gas from the processing vessel; and repeating the supplying the first gas and the supplying the second gas by opening a first valve for introducing the first gas into the processing vessel and closing a second valve for introducing the second gas into the processing vessel, and by closing the first valve for introducing the first gas into the processing vessel and opening the second valve for introducing the second gas into the processing vessel, wherein the supplying the first gas and the supplying the second gas are repeated with the purging the processing vessel being carried out between the supplying the first and second gases so that residual gas present in the processing vessel after performing the supplying the first and second gases is reduced to a level of 1 to 30% based on an entire capacity of the processing vessel, and wherein said first and second gasses temporally exist in the processing vessel at different times.

2. The method according to claim 1, wherein said refractory metal film is a W film which is formed by alternately repeating a plurality of times the supplying the first and second gases, the first gas including a $WF_6$ gas, and the second gas including boron.

3. The method according to claim 1, wherein said refractory metal film is a $Wsi_x$ film which is formed by alternately repeating a plurality of times the supplying the first and second gases, the first gas including a $WF_6$ gas, the second gas including boron, and at least one of the first and second gases including a silane group gas.

4. The method according to claim 1, wherein a silane group gas is supplied into the processing vessel before initially supplying the first gas toward the substrate.

5. The method according to claim 4, further comprising:
forming a metal layer on the refractory metal film.

6. The method according to claim 5, wherein the metal layer is a W layer having a thickness greater than a thickness of the refractory metal film.

7. The method according to claim 4, further comprising:
supplying a silane group gas between the formations of the refractory metal film and metal layer.

8. The method according to claim 1, wherein said refractory metal film is a $WSI_x$ film which is formed by alternately repeating the supplying the first and second gases a plurality of times, the first gas including a $WF_6$ gas and an $SiH_4$ gas and the second gas including boron.

9. The method according to claim 1, wherein said refractory metal film is a W film which is formed by alternately repeating the supplying the first and second gases a plurality of times, the first gas including a $B_2H_6$ gas and a $WF_6$ gas and the second gas including boron.

10. The method according to claim 9, wherein the second gas is a $B_2H_6$ gas supplied before the supplying the first gas.

11. The method according to claim 1, wherein said refractory metal film is a W film which is formed by alternately repeating the supplying the first and second gases a plurality of times, the first gas including a $WF_6$ gas and the second gas including boron.

12. The method according to claim 1, wherein the supporting member immovably supports the substrate.

13. A method of forming a nuclear layer formed by a refractory metal film doped with at least one of III or V group elements, using an apparatus comprising (i) a cylindrical processing vessel having a longitudinal axis, (ii) a supporting member which is provided in the processing vessel and supports a plurality of substrates along the longitudinal axis in an interval, (iii) a heater which is provided around the substrates and heats the substrates supported by the supporting member, (iv) a gas supply mechanism having at least one gas spray port provided on one side of the processing vessel, for spraying gases into the processing vessel, (v) an evacuating mechanism for evacuating the processing vessel so that the gases sprayed into the processing vessel flow from said one side to the other side of the processing vessel, (vi) a first gas source for storing a first gas including refractory metallic atoms, (vii) a second gas source for storing a second gas including at least one of III or V group elements, (viii) a third gas source for storing an inert gas, and (ix) first to third gas introducing pipes for selective fluid communication between the first to third gas sources and the gas supply mechanism, the method comprising:

supplying the first gas from the first gas source through the first gas introducing pipe and through the gas supply mechanism toward the substrate within the processing vessel;

supplying the second gas from the second gas source through the second gas introducing pipe and through the gas supply mechanism toward and across the substrate within the processing vessel, wherein the gases sprayed into the processing vessel flow from said one side to the other side of the processing vessel;

purging the processing vessel by evacuating the processing vessel by the evacuating mechanism, while supplying the inert gas from the third source through the third gas introducing pipe and through the gas supply mechanism into the processing vessel, while the processing vessel is evacuated by the evacuating mechanism to exhaust the inert gas from the processing vessel; and repeating the supplying the first gas and the supplying the second gas by opening a first valve for introducing the first gas into the processing vessel and closing a second valve for introducing the second gas into the processing vessel, and by closing the first valve for introducing the first gas into the processing vessel and opening the second valve for introducing the second gas into the processing vessel, wherein the supplying the first process gas and the supplying the second gas are repeated with the purging the processing vessel being carried out between the supplying the first and second gases to form the refractory metal film by atomic layer deposition, so that residual gas present in the processing vessel after performing the supplying the first and second gases is reduced to a level of 1 to 30% based on an entire capacity of the processing vessel, and wherein said first and second gasses temporally exist in the processing vessel at different times.

14. The method according to claim 13, wherein said refractory metal film is a $WSI_x$ film which is formed by alternately repeating the supplying the first and second gases a plurality of times, the first gas including a $SiH_4$ gas and a $WF_6$ gas and the second gas including boron.

15. The method according to claim 14, wherein the second gas is supplied before the supplying of the first gas.

16. The method according to claim 13, wherein said refractory metal film is a W film which is formed by alternately repeating the supplying the first and second gases a plurality of times, the first gas including a $WF_6$ gas and the second gas including boron.

17. The method according to claim 13, wherein said metal film is a W film which is formed by alternately repeating the supplying the first and second gases a plurality of times, the first gas including a $WF_6$ gas and the second gas including boron.

18. The method according to claim 13, wherein the supporting member immovably supports the substrate.

19. A method of forming a refractory metal film doped with at least one of III or V group elements, using an apparatus comprising (i) a processing vessel, (ii) a supporting member which is provided in the processing vessel and supports a substrate, (iii) a heater which heats the substrate supported by the supporting member, (iv) first and second gas supply mechanisms for supplying gases into the processing vessel, the first gas supplying mechanism having at least one first gas supply port provided on one side of the processing vessel, the second gas supply mechanism having at least one second gas supply port provided on the other side of the processing vessel, and the substrate being positioned between the first and second gas supply ports, (v) first and second evacuating mechanisms for evacuating the processing vessel, the first evacuating mechanism having at least one first gas evacuating port provided on the other side of the processing vessel, the second evacuating mechanism having at least one second evacuating port provided on said one side, and the substrate being positioned between the first and second evacuating ports, (vi) a switching mechanism for intermittently switching between a gas flow from the first gas supply port to the first exhaust port and a gas flow from the second gas supply port to the second exhaust port, (vii) a first gas source for storing a first gas including refractory metallic atoms, (viii) a second gas source for storing a second gas including at least one of III or V group elements, (ix) a third gas source for storing an inert gas, and (x) first to third gas introducing pipes for selective fluid communication between the first to third gas sources and the first and second gas supply mechanisms, the method comprising:

supplying the first gas from the first gas source through the first gas introducing pipe and through the first gas supply mechanism in a first direction toward and across the substrate within the processing vessel;

supplying the second gas from the second gas source through the second gas introducing pipe and through the second gas supply mechanism in a second direction toward and across the substrate within the processing vessel, wherein the first and second directions result in the gases sprayed into the processing vessel flowing from said one side to the other side of the processing vessel;

purging the processing vessel by evacuating the processing vessel by the evacuating mechanisms, while supplying the inert gas from the third source through the third gas introducing pipe and through at least one of the first and second gas supply mechanisms into the processing vessel, while the processing vessel is evacuated by the evacuating mechanisms to exhaust the inert gas from the processing vessel; and repeating the supplying the first gas and the supplying the second gas by opening a first valve for introducing the first gas into the processing vessel and closing a second valve for introducing the second gas into the processing vessel, and by closing the first valve for introducing the first gas into the processing vessel and opening the second valve for introducing the second gas into the processing vessel, wherein the supplying the first gas and the supplying the second gas are repeated with the purging the processing vessel being carried out between the supplying the first and second gases to form the refractory metal film by atomic layer deposition, so that residual gas present in the processing vessel after performing the supplying the first and second gases is reduced to a level of 1 to 30% based on an entire capacity of the processing vessel, and wherein said first and second gasses temporally exist in the processing vessel at different times.

20. The method according to claim 19, further comprising: forming a metal layer on the refractory metal film, wherein the metal layer is a W layer having a thickness greater than a thickness of the refractory metal film.

21. The method according to claim 19, wherein the supporting member immovably supports the substrate.

* * * * *